United States Patent
Kida et al.

(10) Patent No.: US 10,110,199 B2
(45) Date of Patent: Oct. 23, 2018

(54) ACOUSTIC WAVE FILTER, DUPLEXER, AND MODULE

(71) Applicant: TAIYO YUDEN CO., LTD., Tokyo (JP)

(72) Inventors: Masumi Kida, Tokyo (JP); Tokihiro Nishihara, Tokyo (JP); Yoshio Sato, Tokyo (JP); Shinji Taniguchi, Tokyo (JP); Taisei Irieda, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 169 days.

(21) Appl. No.: 15/203,525

(22) Filed: Jul. 6, 2016

(65) Prior Publication Data
US 2017/0019085 A1   Jan. 19, 2017

(30) Foreign Application Priority Data

Jul. 14, 2015 (JP) ................................ 2015-140882

(51) Int. Cl.
*H03H 9/56* (2006.01)
*H03H 9/02* (2006.01)
(Continued)

(52) U.S. Cl.
CPC ........ *H03H 9/568* (2013.01); *H03H 9/02086* (2013.01); *H03H 9/205* (2013.01);
(Continued)

(58) Field of Classification Search
CPC ........ H03H 9/205; H03H 9/542; H03H 9/564; H03H 9/568; H03H 9/706; H03H 9/02086
(Continued)

(56) References Cited

U.S. PATENT DOCUMENTS

| 2008/0055021 A1 | 3/2008 | Ueda et al. |
| 2008/0252398 A1 | 10/2008 | Jamneala et al. |
| 2015/0097638 A1* | 4/2015 | Yu .......................... H03H 9/605 333/189 |

FOREIGN PATENT DOCUMENTS

| JP | 2004-7250 A | 1/2004 |
| JP | 2008-85989 A | 4/2008 |
| JP | 2009-10932 A | 1/2009 |

OTHER PUBLICATIONS

Japanese Office Action dated Mar. 20, 2018, in a counterpart Japanese patent application No. 2015-140882. (A machine translation (not reviewed for accuracy) attached.).

* cited by examiner

*Primary Examiner* — Robert J Pascal
*Assistant Examiner* — Jorge Salazar, Jr.
(74) *Attorney, Agent, or Firm* — Chen Yoshimura LLP

(57) ABSTRACT

An acoustic wave filter includes: series resonators connected in series; and one or more parallel resonators connected in parallel, wherein at least two series resonators and a parallel resonator therebetween are divided into a first divided resonator, which includes a piezoelectric substance sandwiched between a pair of electrodes in a c-axis orientation direction, and a second divided resonator, which includes another piezoelectric substance sandwiched between another pair of electrodes so that the another pair of electrodes in the c-axis orientation direction has an electric potential opposite to that of the electrodes of the first divided resonator in the c-axis orientation direction, a first group including the first divided resonators and a second group including the second divided resonators are interconnected in parallel between two nodes, and the first divided resonators and the second divided resonators of the at least two (Continued)

series resonators are not electrically interconnected at the two nodes.

14 Claims, 32 Drawing Sheets

(51) Int. Cl.
*H03H 9/205* (2006.01)
*H03H 9/54* (2006.01)
*H03H 9/70* (2006.01)
(52) U.S. Cl.
CPC ............ *H03H 9/542* (2013.01); *H03H 9/564* (2013.01); *H03H 9/706* (2013.01)
(58) Field of Classification Search
USPC ................................ 333/133, 187, 188, 189
See application file for complete search history.

ACOUSTIC WAVE FILTER, DUPLEXER, AND MODULE

CROSS-REFERENCE TO RELATED APPLICATION

This application is based upon and claims the benefit of priority of the prior Japanese Patent Application No. 2015-140882, filed on Jul. 14, 2015, the entire contents of which are incorporated herein by reference.

FIELD

A certain aspect of the present invention relates to an acoustic wave filter, a duplexer, and a module.

BACKGROUND

There has been known, as a filter used for communication devices such as mobile phones, a ladder-type filter in which piezoelectric thin film resonators including a piezoelectric substance sandwiched between upper and lower electrodes are connected in a ladder format. A duplexer and a module including two or more filters may be installed in a communication device.

When large electrical power is input to the piezoelectric thin film resonator, non-linearity depending on the c-axis orientation of the piezoelectric substance causes secondary distortion (second harmonic) in output signals. As a method of reducing the secondary distortion, it has been known to serially divide a piezoelectric thin film resonator included in a ladder-type filter and make the electrodes of the divided resonators in the c-axis orientation direction or the polarization axis direction of the piezoelectric substance of the divided resonators have an identical electric potential, or to divide a piezoelectric thin film resonator in parallel and make the electrodes of the divided resonators in the c-axis orientation direction or the polarization axis direction of the piezoelectric substance of the divided resonators have opposite electric potentials as disclosed in, for example, Japanese Patent Application Publication Nos. 2008-85989 and 2009-10932.

When a piezoelectric thin film resonator is serially divided, resonators having an electrostatic capacitance of 2C are to be connected in series where C represents the electrostatic capacitance of the piezoelectric thin film resonator before division. This results in increase in the area of a resonance region. On the other hand, when the piezoelectric thin film resonator is divided in parallel, the increase in the area of the resonance region is inhibited. However, a wiring line that switches upper and lower electrodes sandwiching a piezoelectric substance is to be formed to make the electrodes in the c-axis orientation direction or the polarization axis direction of the piezoelectric substance of the divided resonators obtained by dividing a piezoelectric resonator included in a ladder-type filter in parallel have opposite electric potentials. Accordingly, the region in which the wiring line is to be formed needs securing, and thus the filter increases in size.

SUMMARY OF THE INVENTION

According to a first aspect of the present invention, there is provided an acoustic wave filter including: two or more series resonators connected in series between an input terminal and an output terminal and formed of a piezoelectric thin film resonator; and one or more parallel resonators connected in parallel between the input terminal and the output terminal and formed of a piezoelectric thin film resonator, wherein each of at least two series resonators and a parallel resonator between the at least two series resonators among the two or more series resonators and the one or more parallel resonators is divided into a first divided resonator and a second divided resonator, the first divided resonator including a piezoelectric substance sandwiched between a pair of electrodes in a direction of a c-axis orientation or a polarization axis of the piezoelectric substance, the second divided resonator including another piezoelectric substance sandwiched between another pair of electrodes so that the another pair of electrodes located in the direction of the c-axis orientation or the polarization axis is at an electric potential opposite to an electric potential of the pair of electrodes of the first divided resonator in the direction of the c-axis orientation or the polarization axis, a first resonator group, which includes the first divided resonators of the at least two series resonators and the parallel resonator between the at least two series resonators, and a second resonator group, which includes the second divided resonators of the at least two series resonators and the parallel resonator between the at least two series resonators, are connected in parallel to each other between a first node, which is closer to the input terminal than the first resonator group and the second resonator group, and a second node, which is closer to the output terminal than the first resonator group and the second resonator group, and the first divided resonators and the second divided resonators of the at least two series resonators are not electrically interconnected at other than the first node and the second node.

According to a second aspect of the present invention, there is provided an acoustic wave filter including: one or more series resonators connected in series between an input terminal and an output terminal and formed of a piezoelectric thin film resonator; and two or more parallel resonators connected in parallel between the input terminal and the output terminal and formed of a piezoelectric thin film resonator, wherein each of two parallel resonators and a series resonator between the two parallel resonators among the two or more parallel resonators and the one or more series resonators is divided into a first divided resonator and a second divided resonator, the first divided resonator including a piezoelectric substance sandwiched between a pair of electrodes in a direction of a c-axis orientation or a polarization axis of the piezoelectric substance, and the second divided resonator including another piezoelectric substance sandwiched between another pair of electrodes so that the another pair of electrodes in the direction of the c-axis orientation or the polarization axis is at an electric potential opposite to an electric potential of the pair of electrodes of the first divided resonator in the direction of the c-axis orientation or the polarization axis, a first resonator group, which includes the first divided resonators of the two parallel resonators and the series resonator between the two parallel resonators, and a second resonator group, which includes the second divided resonators of the two parallel resonators and the series resonator between the two parallel resonators, are connected in parallel to each other between a first node, which is closer to the input terminal than the first resonator group and the second resonator group, and a second node, which is closer to the output terminal than the first resonator group and the second resonator group, and the first divided resonator and the second divided resonator of the series resonator between the two parallel resonators are not electrically interconnected at other than the first and second nodes.

According to a third aspect of the present invention, there is provided a duplexer including: a transmit filter; and a receive filter, wherein at least one of the transmit filter and the receive filter is the above acoustic wave filter.

According to a fourth aspect of the present invention, there is provided a module including: the above acoustic wave filter.

DETAILED DESCRIPTION

Figure 1A:
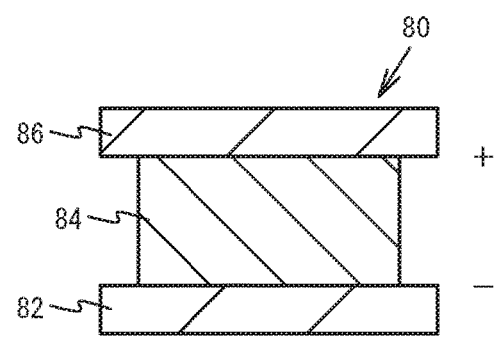
FIG. 1A and FIG. 1B illustrate a piezoelectric thin film resonator including a piezoelectric substance sandwiched between a pair of electrodes.
Figure 1B:
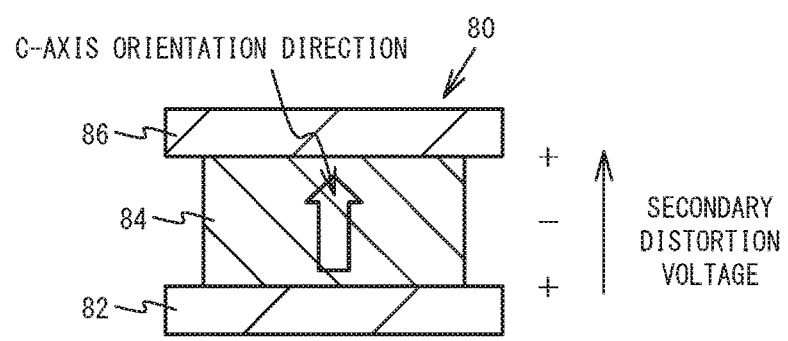

First, secondary distortion voltage generated in a piezoelectric substance of a piezoelectric thin film resonator will be described. FIG. 1A and FIG. 1B illustrate a piezoelectric thin film resonator 80 including a piezoelectric substance 84 sandwiched between a pair of electrodes (a lower electrode 82 and an upper electrode 86). In the piezoelectric thin film resonator, one-half of the wavelength ($\lambda$) of the resonant frequency corresponds to the thickness of the piezoelectric substance. That is, the piezoelectric thin film resonator is a resonator using a $\frac{1}{2}\lambda$-thickness resonance. Accordingly, as illustrated in FIG. 1A, the upper and lower surfaces of the piezoelectric substance 84 excite so that one of them polarizes positive (+) and the other polarizes negative (−).

On the other hand, the wavelength of the frequency of secondary distortion corresponds to the thickness of the piezoelectric substance. Thus, as illustrated in FIG. 1B, both the upper and lower surfaces of the piezoelectric substance 84 excite so that both of them polarize positive (+) or negative (−). When the piezoelectric substance 84 has symmetry, the upper and lower electrodes are at an identical electric potential in the secondary mode. In this case, the distortion component is not generated theoretically. However, when aluminum nitride (AlN) or zinc oxide (ZnO) is used as the piezoelectric substance 84 to obtain good characteristics, and the piezoelectric substance 84 is sandwiched between the lower electrode 82 and the upper electrode 86 in the c-axis orientation direction of the piezoelectric substance 84, the symmetry in the c-axis orientation is distorted, and the electric field may have uneven distributions. In FIG. 1B, an arrow in the piezoelectric substance 84 indicates the c-axis orientation direction of the piezoelectric substance 84. The uneven distribution of the electric field causes an electric potential difference between the upper and lower surfaces of the piezoelectric substance 84. A voltage thus generated is referred to as secondary distortion voltage, and indicated by another arrow lateral to the piezoelectric substance 84. In FIG. 1B, the c-axis is oriented in the direction from the lower electrode 82 to the upper electrode 86, and the secondary distortion voltage is generated in the above direction.

Figure 2A:
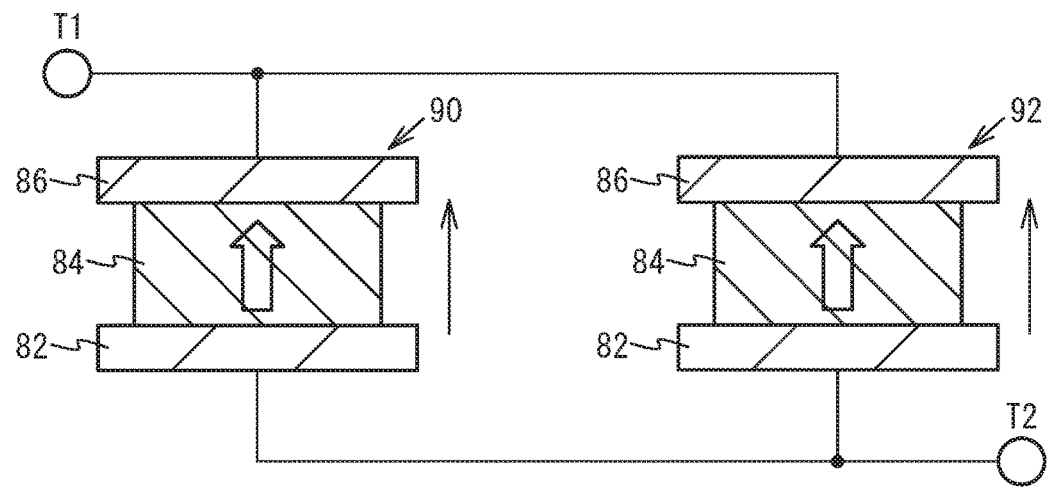
FIG. 2A illustrates a case where secondary distortion voltage is not reduced.
Figure 2B:
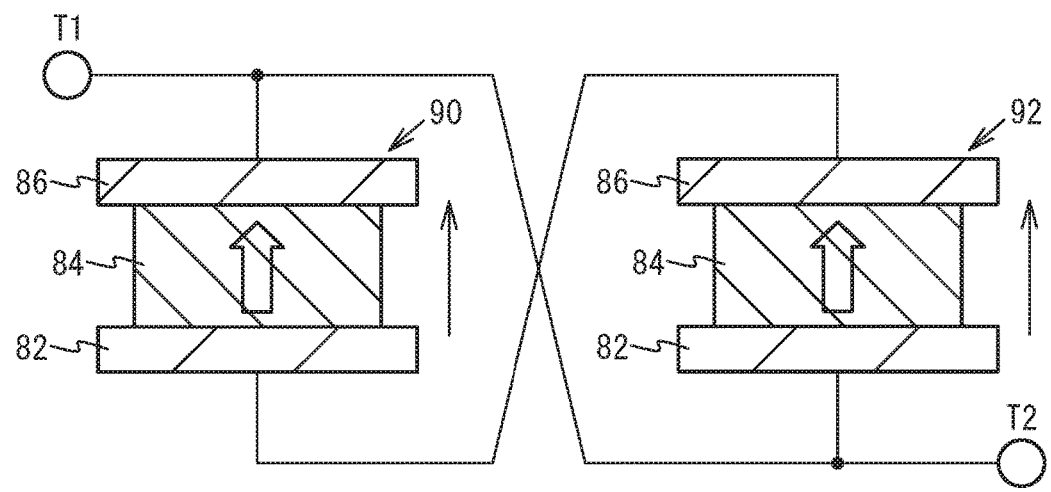
FIG. 2B illustrates a case where secondary distortion voltage is reduced.

A method of reducing the secondary distortion voltage will be described with use of FIG. 2A and FIG. 2B. FIG. 2A illustrates a case where the secondary distortion voltage is not reduced, and FIG. 2B illustrates a case where the secondary distortion voltage is reduced. In FIG. 2A, a first piezoelectric thin film resonator 90 and a second piezoelectric thin film resonator 92 are connected in parallel. The first piezoelectric thin film resonator 90 and the second piezoelectric thin film resonator 92 are connected so that the electrodes of the first and second thin film resonators 90 and 92 in the c-axis orientation directions are at an identical potential.

That is, the upper electrodes 86 of the first and second piezoelectric thin film resonators 90 and 92 in the c-axis orientation direction are connected so as to have an identical electric potential. The lower electrodes 82 of the first and second piezoelectric thin film resonators 90 and 92 in the reverse direction of the c-axis orientation are connected so as to have an identical electric potential. Accordingly, the secondary distortion voltages of the first and second piezoelectric thin film resonators 90 and 92 are applied from a terminal T2 to a terminal T1. Thus, the secondary distortion voltages of the first and second piezoelectric thin film resonators 90 and 92 mutually intensifies.

In contrast, in FIG. 2B, the first and second piezoelectric thin film resonators 90 and 92 are connected in parallel so that the electrodes of the first and second piezoelectric thin film resonators 90 and 92 in the c-axis orientation direction are at opposite electric potentials. That is, the upper electrode 86 of the first piezoelectric thin film resonator 90 and the lower electrode 82 of the second piezoelectric thin film resonator 92 are connected, and the lower electrode 82 of the first piezoelectric thin film resonator 90 and the upper electrode 86 of the second piezoelectric thin film resonator 92 are connected. Accordingly, the secondary distortion voltage of the first piezoelectric thin film resonator 90 is applied from the terminal T2 to the terminal T1, and the secondary distortion voltage of the second piezoelectric thin film resonator 92 is applied from the terminal T1 to the terminal T2. Thus, the secondary distortion voltages of the first and second piezoelectric thin film resonators 90 and 92 cancel out each other. Therefore, the secondary distortion is reduced. Based on the above described method of reducing secondary distortion, embodiments will be described.

First Embodiment

Figure 3:
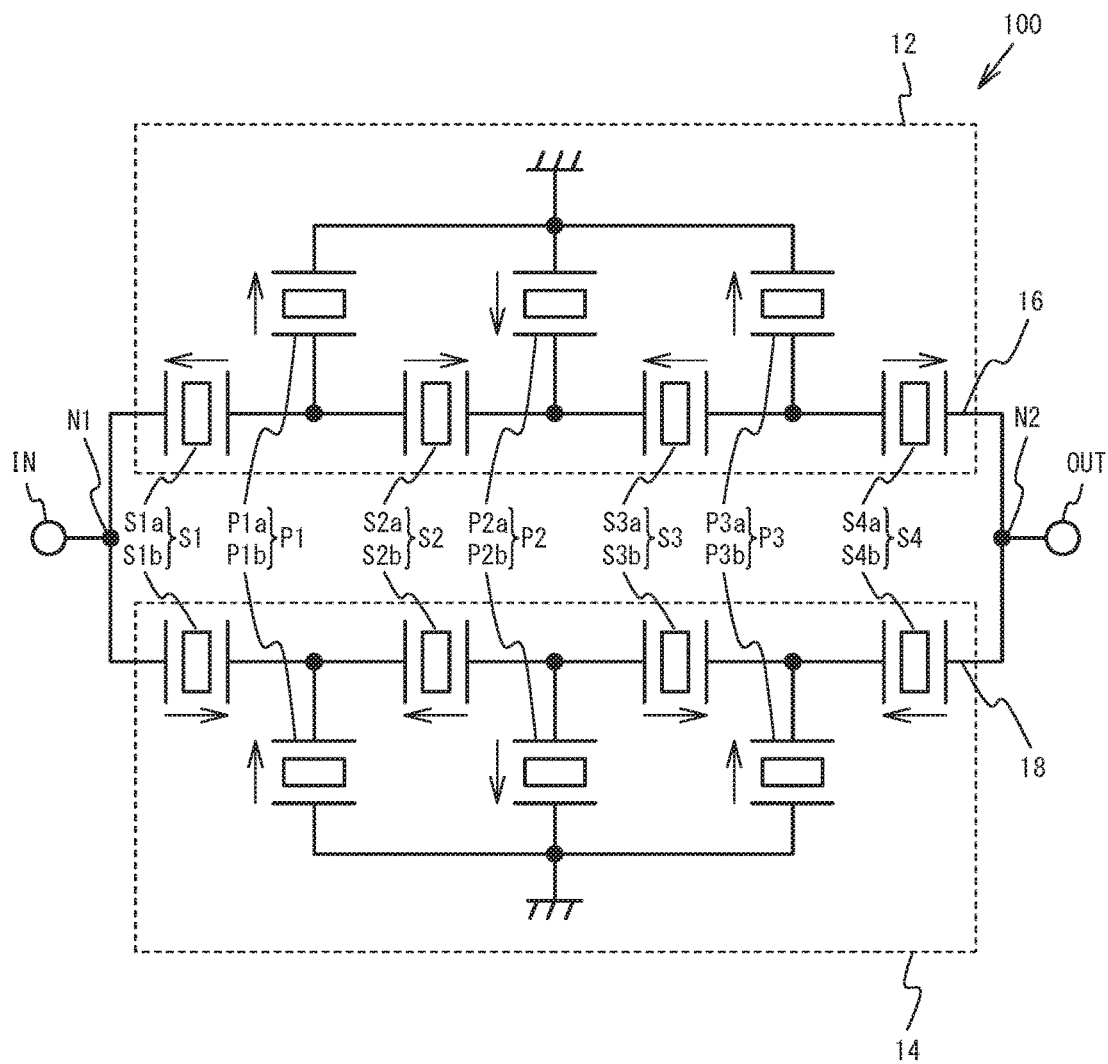
FIG. 3 illustrates a ladder-type filter in accordance with a first embodiment.

FIG. 3 illustrates a ladder-type filter 100 in accordance with a first embodiment. In FIG. 3, an allow arranged along the side of each resonator indicates the direction of the secondary distortion voltage (the same applies to FIG. 7, FIG. 8, FIG. 10, FIG. 11, FIG. 13, FIG. 15, FIG. 17, FIG. 19, FIG. 21, FIG. 23, FIG. 25, FIG. 26, FIG. 28, and FIG. 29). As illustrated in FIG. 3, the ladder-type filter 100 of the first embodiment includes one or more series resonators S1 through S4 connected in series and one or more parallel resonators P1 through P3 connected in parallel between an input terminal IN and an output terminal OUT. The series resonator S1 is divided into a first divided resonator S1a and a second divided resonator S1b that is connected in parallel to the first divided resonator S1a. The series resonators S2 through S4 and the parallel resonators P1 through P3 are also respectively divided into first divided resonators S2a, S3a, S4a, P1a, P2a, and P3a and second divided resonators S2b, S3b, S4b, P1b, P2b, and P3b each being connected in parallel to the corresponding first divided resonator.

The first divided resonators S1a through S4a and P1a through P3a are arranged in a first path 16 connected between a node N1, which is located closer to the input terminal IN than the series resonators S1 through S4 that have been divided, and a node N2, which is located closer to the output terminal OUT than the series resonators S1 through S4 that have been divided. The second divided resonators S1b through S4b and P1b through P3b are arranged in a second path 18 that is connected between the nodes N1 and N2 and differs from the first path 16. That is, the first divided resonator S1a through S4a and P1a through P3a are located in the first path 16 of which a first end is connected to the node N1 between the input terminal IN and the series resonator S1 and of which a second end is connected to the node N2 between the output terminal OUT and the series resonator S4. The second divided resonator S1b through S4b and P1b through P3b are located in the second path 18 of which a first end is connected to the node N1 and of which a second end is connected to the node N2.

The first and second paths 16 and 18 are connected in parallel to each other between the nodes N1 and N2. Thus, a first resonator group 12, which includes the first divided resonator S1a through S4a and P1a through P3a, and a second resonator group 14, which includes the second divided resonator S1b through S4b and P1b through P3b, are connected in parallel to each other between the node N1, which is located closer to the input terminal IN than the first and second resonator groups 12 and 14, and the node N2, which is located closer to the output terminal OUT than the first and second resonator groups 12 and 14. The first divided resonators S1a through S4a of the series resonators S1 through S4 and the second divided resonators S1b through S4b of the series resonators S1 through S4 are not electrically interconnected at other than the nodes N1 and N2.

The first and second divided resonators S1a and S1b are connected so that the electrodes of the first and second divided resonators S1a and S1b in the c-axis orientation direction of the piezoelectric substance are at opposite electric potentials. Thus, the secondary distortion voltages are generated in opposite directions. In the same manner, the first and second divided resonators S2a and S2b, the first and second divided resonators S3a and S3b, and the first and second divided resonators S4a and S4b are also connected so that the electrodes in the c-axis orientation direction of the piezoelectric substance are at opposite electric potentials. Thus, the secondary distortion voltages are generated in opposite directions. Also in the parallel resonators, the first and the second divided resonators P1a and P1b, the first and second divided resonators P2a and P2b, and the first and second divided resonators P3a and P3b are connected so that the electrodes in the c-axis orientation direction of the piezoelectric substance are at opposite electric potentials. Thus, the secondary distortion voltages are generated in opposite directions.

The first and second divided resonators S1a and S1b have electrostatic capacitances of approximately one-half of the electrostatic capacitance of the series resonator S1, and have approximately an identical electrostatic capacitance. The first and second divided resonators S1a and S1b have approximately the same resonant frequency and approximately the same impedance. In the same manner, the first and second divided resonators S2a and S2b have electrostatic capacitances of approximately one-half of the electrostatic capacitance of the series resonator S2, and have approximately an identical electrostatic capacitance, the first and second divided resonators S3a and S3b have electrostatic capacitances of approximately one-half of the electrostatic capacitance of the series resonator S3, and have approximately an identical electrostatic capacitance, and the first and second divided resonators S4a and S4b have electrostatic capacitances of approximately one-half of the electrostatic capacitance of the series resonators S4, and have approximately an identical electrostatic capacitance. The first and second divided resonators S2a and S2b have approximately the same resonant frequency and approximately the same impedance, the first and second divided resonators S3a and S3b have approximately the same resonant frequency and approximately the same impedance, and the first and second divided resonators S4a and S4b have approximately the same resonant frequency and approximately the same impedance. Also in the parallel resonators, the first and second divided resonators P1a and P1b have electrostatic capacitances of approximately one-half of the electrostatic capacitance of the parallel resonator P1, and have approximately an identical electrostatic capacitance, the first and second divided resonators P2a and P2b have electrostatic capacitances of approximately one-half of the electrostatic capacitance of the parallel resonator P2, and have approximately an identical electrostatic capacitance, and the first and second divided resonators P3a and P3b have electrostatic capacitances of approximately one-half of the electrostatic capacitance of the parallel resonator P3, and have approximately an identical electrostatic capacitance. The first and second divided resonators P1a and P1b have approximately the same resonant frequency and approximately the same impedance, the first and second divided resonators P2a and P2b have approximately the same resonant frequency and approximately the same impedance, and the first and second divided resonators P3a and P3b have approximately the same resonant frequency and approximately the same impedance. Approximately the same contains the difference by the production error.

Figure 4A:
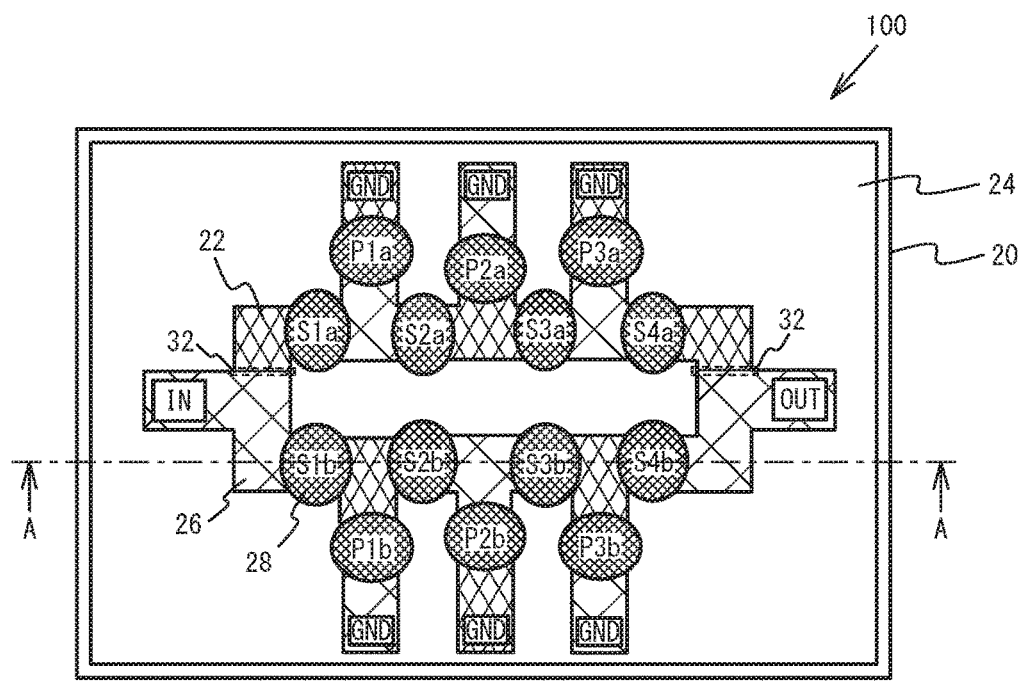
FIG. 4A is a top view of the ladder-type filter in accordance with the first embodiment.
Figure 4B:
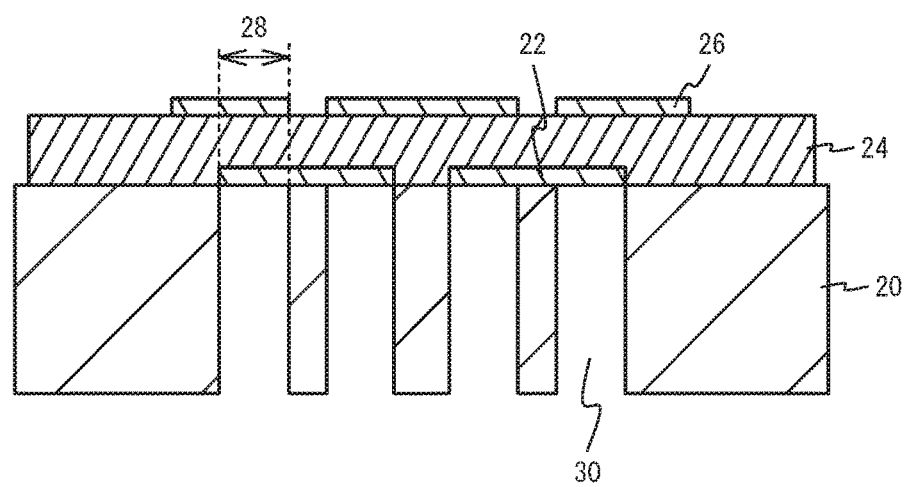
FIG. 4B is a cross-sectional view taken along line A-A in FIG. 4A.

FIG. 4A is a top view of the ladder-type filter 100 in accordance with the first embodiment, and FIG. 4B is a cross-sectional view taken along line A-A in FIG. 4A. As illustrated in FIG. 4A and FIG. 4B, the first divided resonators S1a through S4a and P1a through P3a and the second divided resonators S1b through S4b and P1b through P3b are piezoelectric thin film resonators each including a pair of electrodes (a lower electrode 22 and an upper electrode 26) sandwiching a piezoelectric substance 24 formed into a thin film. The lower electrode 22, the piezoelectric substance 24, and the upper electrode 26 are located on a substrate 20. A region where the lower electrode 22 and the upper electrode 26 face each other across the piezoelectric substance 24 is a resonance region 28. The resonance region 28 has, for example, an elliptical shape, and is a region in which an acoustic wave in a thickness extension mode excites. The resonance region 28 may have a shape such as a polygonal shape other than the elliptical shape. A recessed portion is formed in the substrate 20 in the resonance region 28, and the recessed portion forms an air gap 30. The recessed portion may penetrate or may not penetrate through the substrate 20. Instead of the recessed portion, a dome-shaped air gap may be formed between the flat upper surface of the substrate 20 and the lower electrode 22. Instead of the air gap, an acoustic mirror may be formed. An input electrode IN, an output electrode OUT, and ground electrodes GND are, for example, bumps for flip-chip mounting.

Between the input electrode IN and the first and second divided resonators S1a and S1b, formed is a connection switching portion 32 used to switch the upper electrode 26 and the lower electrode 22 so that the electrodes of the first and second divided resonators S1a and S1b in the c-axis orientation direction of the piezoelectric substance 24 are at opposite electric potentials. In the same manner, between the output electrode OUT and the first and second divided resonators S4a and S4b, formed is the connection switching portion 32 used to switch the upper electrode 26 and the lower electrode 22 so that the electrodes of the first and second divided resonators S4a and S4b in the c-axis orientation direction of the piezoelectric substance 24 are at opposite electric potentials. The connection switching portion 32 has a structure designed so that an aperture from which the lower electrode 22 is exposed to the piezoelectric substance 24 is formed and a metal wiring line connecting the lower electrode 22 exposed in the aperture and the upper electrode 26 on the piezoelectric substance 24 is formed. The structure of the connection switching portion 32 is not limited to the above structure, and may be other structures as long as the lower electrode 22 and the upper electrode 26 are interconnected.

The substrate 20 may be, for example, a silicon substrate, a quartz substrate, a glass substrate, a ceramic substrate, or a gallium arsenide substrate. The lower electrode 22 and the upper electrode 26 may be formed of a single layer metal film such as, for example, chrome (Cr), ruthenium (Ru), aluminum (Al), titanium (Ti), copper (Cu), molybdenum (Mo), tungsten (W), tantalum (Ta), platinum (Pt), rhodium (Rh), or iridium (Ir), or of a multilayered film of at least two of them. The piezoelectric substance 24 may be, for example, aluminum nitride (AlN), or zinc oxide (ZnO).

Figure 5:
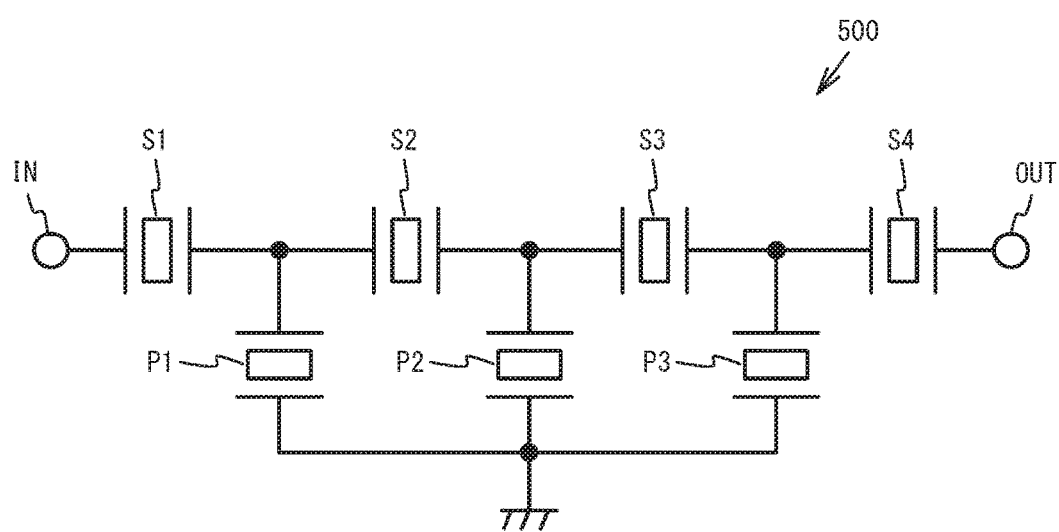
FIG. 5 illustrates a ladder-type filter in accordance with a first comparative example.

Here, the simulation conducted by the inventors will be described. The inventors conducted a simulation for investigating the secondary distortion on the ladder-type filter 100 of the first embodiment. For comparison, the inventors also conducted a simulation for investigating the secondary distortion on a ladder-type filter 500 in accordance with a first comparative example. FIG. 5 illustrates a ladder-type filter 500 of the first comparative example. As illustrated in FIG. 5, the ladder-type filter 500 of the first comparative example differs from the ladder-type filter 100 of the first embodiment in that the series resonators S1 through S4 and the parallel resonators P1 through P3 are not divided. Table 1 lists parameters of the ladder-type filters used for the simulation.

TABLE 1

| | Electrostatic capacitance C0 [pF] | Resonant frequency fr [MHz] | | Electrostatic capacitance C0 [pF] | Resonant frequency fr [MHz] |
|---|---|---|---|---|---|
| S1 | 1.4 | 2530 | S1a | 0.7 | 2530 |
| | | | S1b | 0.7 | 2530 |
| S2 | 0.8 | 2550 | S2a | 0.4 | 2550 |
| | | | S2b | 0.4 | 2550 |
| S3 | 0.8 | 2540 | S3a | 0.4 | 2540 |
| | | | S3b | 0.4 | 2540 |
| S4 | 0.8 | 2540 | S4a | 0.4 | 2540 |
| | | | S4b | 0.4 | 2540 |
| P1 | 2.6 | 2460 | P1a | 1.3 | 2460 |
| | | | P1b | 1.3 | 2460 |
| P2 | 0.9 | 2480 | P2a | 0.45 | 2480 |
| | | | P2b | 0.45 | 2480 |
| P3 | 2.1 | 2460 | P3a | 1.05 | 2460 |
| | | | P3b | 1.05 | 2460 |

As presented in Table 1, the electrostatic capacitance C0 and the resonant frequency of each resonator of the ladder-type filter 500 of the first comparative example were configured to be the same as the electrostatic capacitance C0 and the resonant frequency of the corresponding yet-divided resonator of the ladder-type filter 100 of the first embodiment. In the ladder-type filter 100 of the first embodiment, each resonator after division was configured to have an electrostatic capacitance C0 of one-half of the electrostatic capacitance C0 of the corresponding resonator before division, and to have a resonant frequency fr equal to the resonant frequency fr of the corresponding resonator before division. Aluminum nitride was used for the piezoelectric substance 24.

Figure 6:
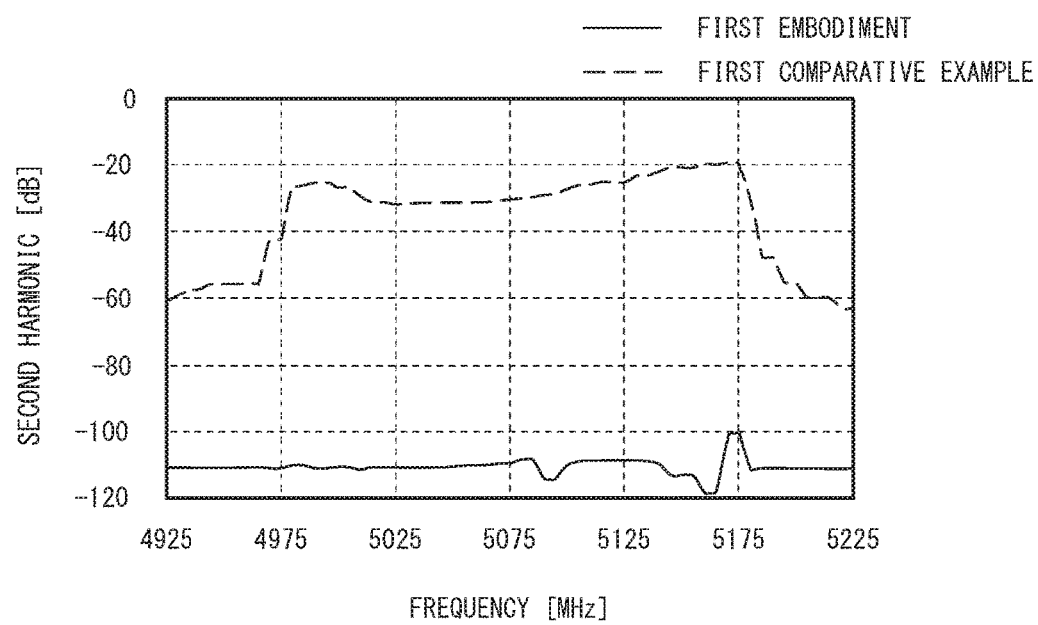
FIG. 6 illustrates the simulation result of the secondary distortion of the ladder-type filter of the first embodiment.

FIG. 6 illustrates the simulation result of the secondary distortion of the ladder-type filter 100 of the first embodiment. The solid line indicates the simulation result of the ladder-type filter 100 of the first embodiment, and the dashed line indicates the simulation result of the ladder-type filter 500 of the first comparative example. The horizontal axis in FIG. 6 represents frequency (MHz). The vertical axis represents second harmonic (dB). As illustrated in FIG. 6, the first embodiment reduces the second harmonic compared with the first comparative example. The reason why the second harmonic is reduced in the ladder-type filter 100 of the first embodiment is considered to be because the secondary distortion voltages cancel out each other since the series resonators S1 through S4 and the parallel resonators P1 through P3 are divided into divided resonators connected in parallel so that the electrodes in the c-axis orientation direction of the piezoelectric substance 24 are at opposite electric potentials.

As described above, the first embodiment respectively divides the series resonators S1 through S4 and the parallel resonators P1 through P3 into the first divided resonators S1a through S4a and P1a through P3a and the second divided resonators S1b through S4b and P1b through P3b. The first divided resonators S1a through S4a and P1a through P3a and the second divided resonators S1b through S4b and P1b through P3b are respectively connected in parallel so that the electrodes in the c-axis orientation direction of the piezoelectric substance 24 are at opposite electric potentials. This configuration allows the secondary distortion voltages to cancel out each other, reducing the secondary distortion.

Figure 7:
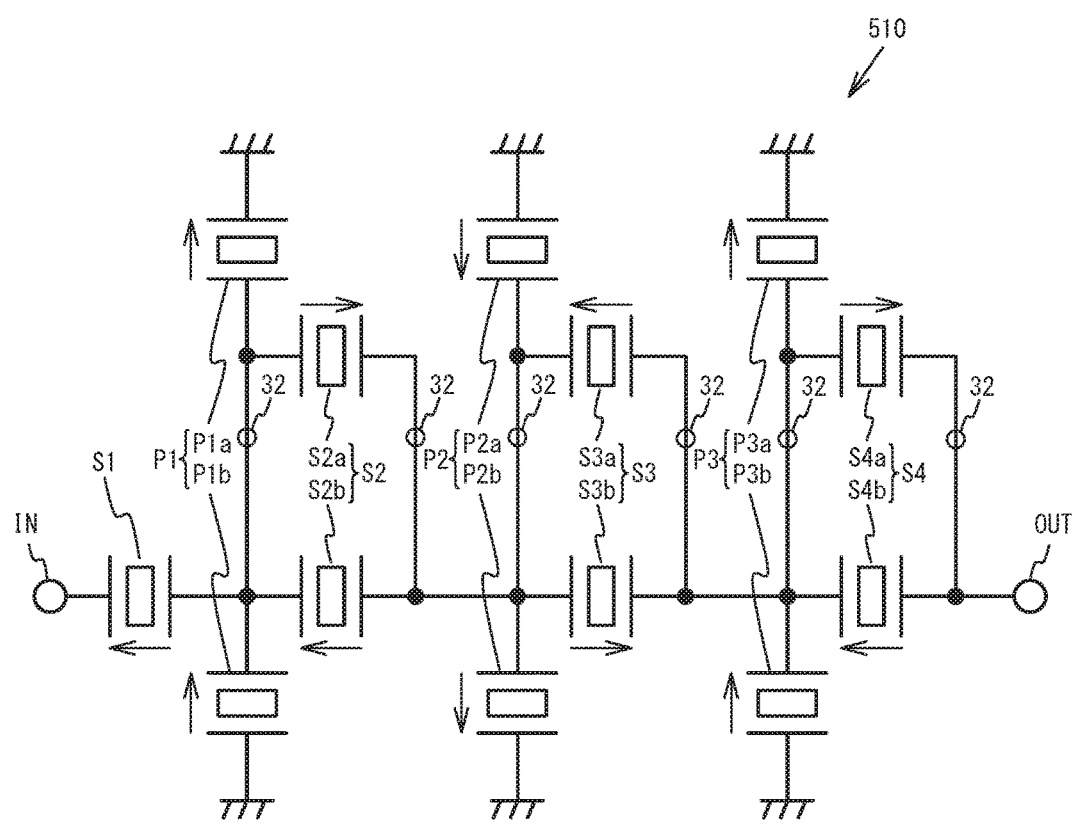
FIG. 7 illustrates a ladder-type filter in accordance with a second comparative example.

FIG. 7 illustrates a ladder-type filter 510 in accordance with a second comparative example. As illustrated in FIG. 7, the ladder-type filter 510 of the second comparative example differs from the ladder-type filter 100 of the first embodiment in that the series resonator S1 is not divided, the series resonator S2 and the parallel resonator P1, the series resonator S3 and the parallel resonator P2, and the series resonator S4 and the parallel resonator P3 are separately divided in parallel as a group.

In the second comparative example, the series resonator S2 and the parallel resonator P1, the series resonator S3 and the parallel resonator P2, and the series resonator S4 and the parallel resonator P3 are separately divided in parallel as a group. Accordingly, six connection switching portions 32 used to switch the upper electrode 26 and the lower electrode 22 are formed. The second comparative example describes a case where three series resonators S2 through S4 are separately divided in parallel as an example. When at least two or more series resonators are separately divided in parallel, four or more connection switching portions 32 are to be formed. The connection switching portion 32 forms a metal wiring line connecting the lower electrode 22 and the upper electrode 26 as described above, and the area in which the wiring line is to be formed is thus secured by increasing the distance between the resonators. Accordingly, as the number of the positions in which the connection switching portion 32 is to be formed increases, the filter increases in size.

In contrast, in the first embodiment, the first resonator group 12, which includes the first divided resonators S1a through S4a and P1a through P3a, and the second resonator group 14, which includes the second divided resonators S1b through S4b and P1b through P3b, are connected in parallel between the nodes N1 and N2. The first divided resonators S1a through S4a and the second divided resonators S1b through S4b of the series resonators S1 through S4 are not electrically interconnected at other than the nodes N1 and N2. This configuration reduces the number of the connection switching portions 32 to two as described in FIG. 4A, and inhibits the filter from increasing in size.

In addition, the first embodiment divides the series resonator S4 closest to the output terminal OUT into the first and second divided resonators S4a and S4b. The resonator closer to the output terminal OUT greatly affects the secondary distortion, and thus the division of the resonator closer to the output terminal OUT effectively reduces the secondary distortion. In the first embodiment, the resonator closest to the output terminal OUT is a series resonator, but the same applies to a case where the resonator closest to the output terminal OUT is a parallel resonator.

In addition, the first embodiment configures each of the series resonators S1 through S4 and the parallel resonators P1 through P3 so that the electrostatic capacitance of the first divided resonator is approximately equal to the electrostatic capacitance of the second divided resonator. This configuration inhibits the increase in the area of the resonance region, and inhibits the filter from increasing in size.

Second Embodiment

Figure 8:
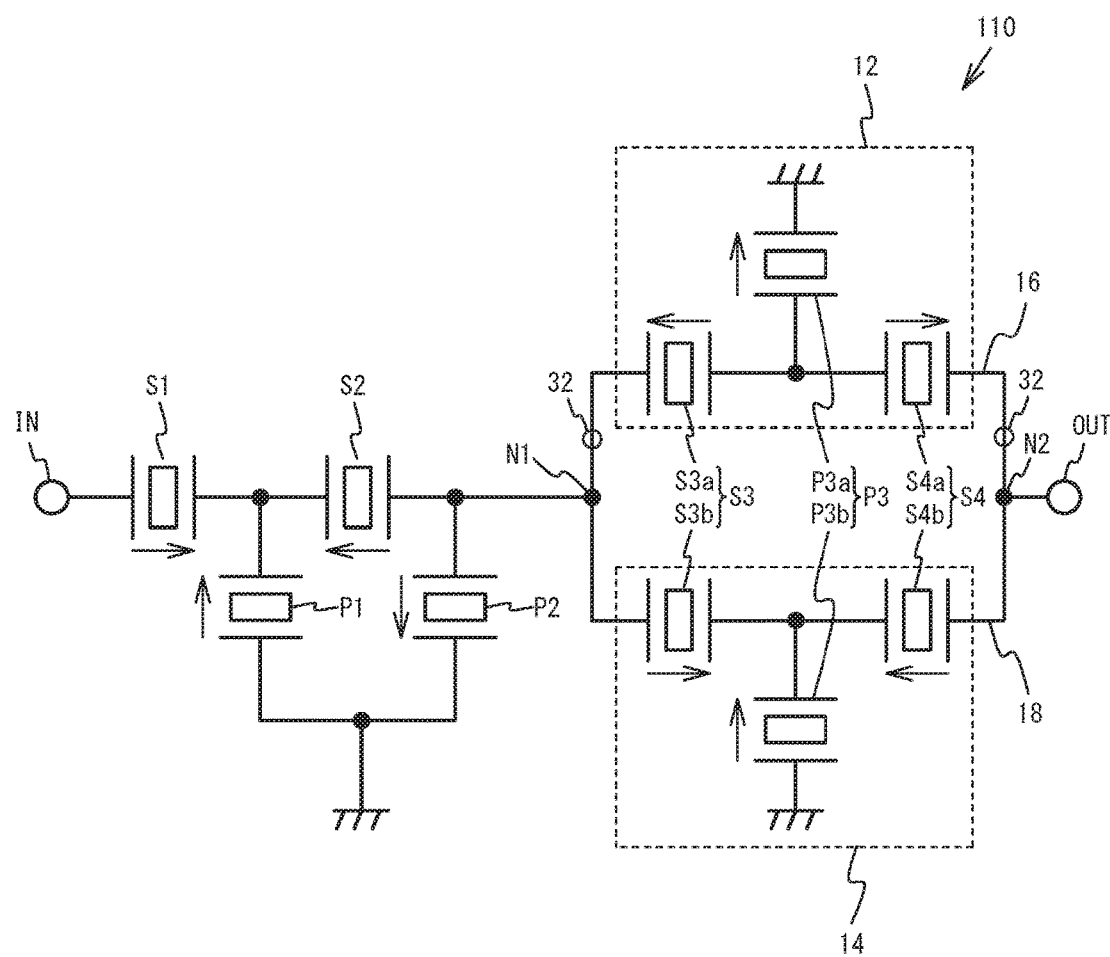
FIG. 8 illustrates a ladder-type filter in accordance with a second embodiment.

FIG. 8 illustrates a ladder-type filter 110 in accordance with a second embodiment. As illustrated in FIG. 8, in the ladder-type filter 110 of the second embodiment, the series resonators S3 and S4 and the parallel resonator P3 are divided in parallel, and the series resonators S1 and S2 and the parallel resonators P1 and P2 are not divided. The first divided resonators S3a, S4a, and P3a are located in the first path 16 between the nodes N1 and N2. The second divided resonators S3b, S4b, and P3b are located in the second path 18 between the nodes N1 and N2. Thus, the first resonator group 12, which includes the first divided resonators S3a, S4a, and P3a, and the second resonator group 14, which includes the second divided resonators S3b, S4b, and P3b, are connected in parallel between the node N1 closer to the input terminal IN than the first and second resonator groups 12 and 14 and the node N2 closer to the output terminal OUT than the first and second resonator groups 12 and 14. The first divided resonators S3a and S4a and the second divided resonators S3b and S4b of the series resonators S3 and S4 are not electrically interconnected at other than the nodes N1 and N2. Other configurations are the same as or similar to those of the first embodiment, and thus the description is omitted.

Figure 9:
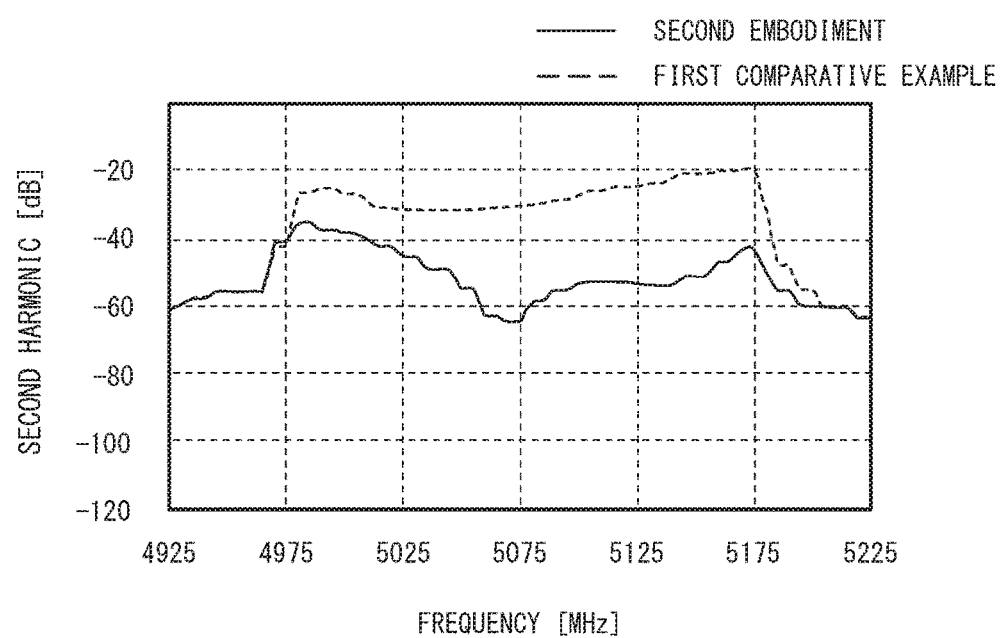
FIG. 9 illustrates the simulation result of the secondary distortion of the ladder-type filter of the second embodiment.

FIG. 9 illustrates the simulation result of the secondary distortion of the ladder-type filter 110 of the second embodiment. For comparison, the simulation result of the ladder-type filter 500 of the first comparative example is also presented. The simulation was conducted with use of parameters listed in Table 1 as in the case of FIG. 6. As illustrated in FIG. 9, the second embodiment reduces the second harmonic compared with the first comparative example.

As described above, the second embodiment respectively divides the series resonators S3 and S4 and the parallel resonator P3 into the first divided resonators S3a, S4a, and P3a and the second divided resonator S3b, S4b, and P3b connected in parallel so that the electrodes in the c-axis orientation direction of the piezoelectric substance 24 are at opposite electric potentials. This configuration allows the secondary distortion voltages to cancel out each other, reducing the secondary distortion.

Figure 10:
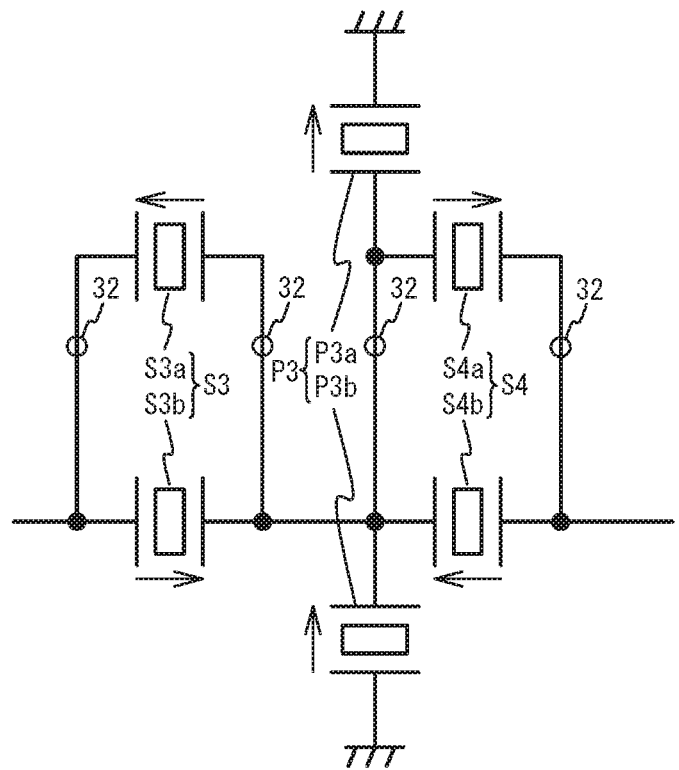
FIG. 10 illustrates a case where two series resonators and a parallel resonator between the two series resonators are divided in parallel in the same manner as in the second comparative example.

FIG. 10 illustrates a case where two series resonators S3 and S4 and the parallel resonator P3 between the series resonators S3 and S4 are divided in parallel in the same manner as in the second comparative example. As illustrated in FIG. 10, when two series resonators S3 and S4 and the parallel resonator P3 between the series resonators S3 and S4 are divided in parallel by the same method as that of the second comparative example, four connection switching portions 32 are formed.

In contrast, in the second embodiment, the first resonator group 12, which includes the first divided resonators S3a, S4a, and P3a, and the second resonator group 14, which includes the second divided resonators S3b, S4b, and P3b, are connected in parallel to each other between the nodes N1 and N2. The first divided resonators S3a and S4a and the second divided resonators S3b and S4b of the series resonators S3 and S4 are not electrically interconnected at other than the nodes N1 and N2. This configuration reduces the number of the connection switching portions 32 to two, and inhibits the filter from increasing in size.

Third Embodiment

Figure 11:
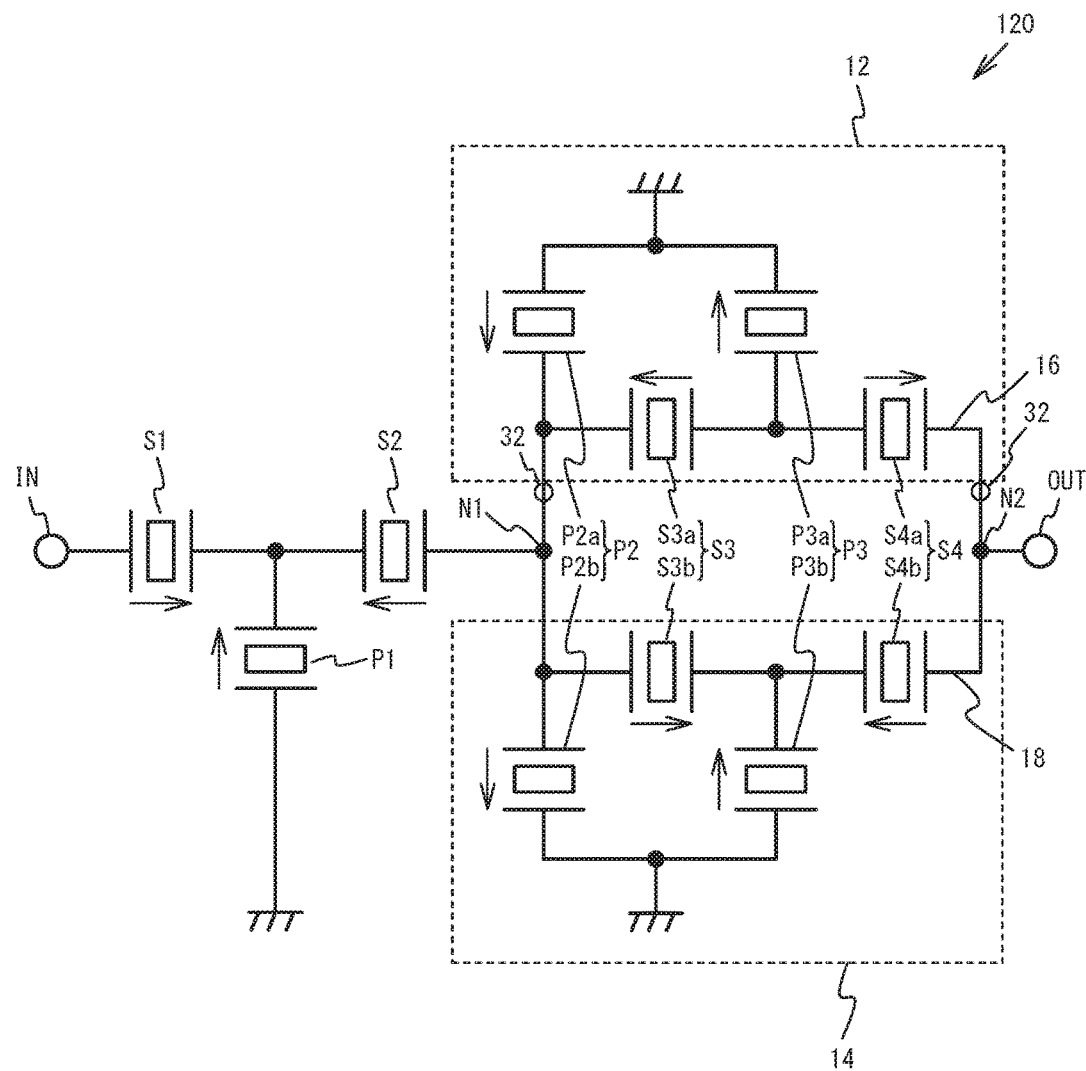
FIG. 11 illustrates a ladder-type filter in accordance with a third embodiment.

FIG. 11 illustrates a ladder-type filter 120 in accordance with a third embodiment. As illustrated in FIG. 11, in the ladder-type filter 120 of the third embodiment, the series resonators S3 and S4 and the parallel resonators P2 and P3 are divided in parallel, and the series resonators S1 and S2 and the parallel resonator P1 are not divided. The first divided resonators S3a, S4a, P2a, and P3a are located in the first path 16 between the nodes N1 and N2. The second divided resonators S3b, S4b, P2b, and P3b are located in the second path 18 between the nodes N1 and N2. Thus, the first resonator group 12, which includes the first divided resonators S3a, S4a, P2a, and P3a, and the second resonator group 14, which includes the second divided resonators S3b, S4b, P2b, and P3b, are connected in parallel to each other between the node N1 closer to the input terminal IN than the first and second resonator groups 12 and 14 and the node N2 closer to the output terminal OUT than the first and second resonator groups 12 and 14. The first divided resonators S3a and S4a and the second divided resonators S3b and S4b of the series resonators S3 and S4 are not electrically interconnected at other than the nodes N1 and N2. Other configurations are the same as or similar to those of the first embodiment, and thus the description is omitted.

Figure 12:
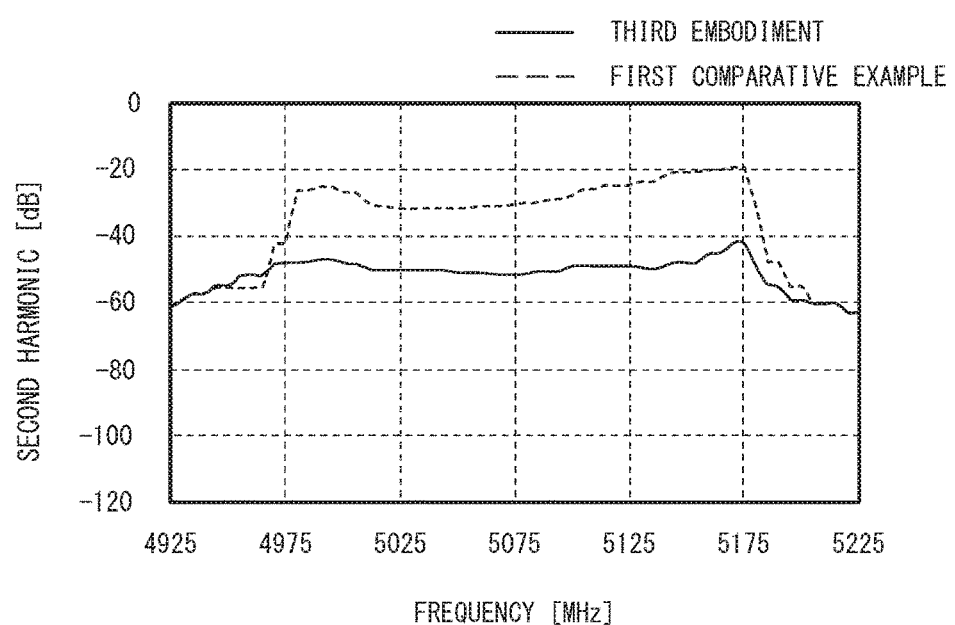
FIG. 12 illustrates the simulation result of the secondary distortion of the ladder-type filter of the third embodiment.

FIG. 12 illustrates the simulation result of the secondary distortion of the ladder-type filter 120 of the third embodiment. For comparison, the simulation result of the ladder-type filter 500 of the first comparative example is also presented. The simulation was conducted with use of parameters listed in Table 1 as in the case of FIG. 6. As illustrated in FIG. 12, the third embodiment reduces the second harmonic compared with the first comparative example.

As described above, the third embodiment respectively divides the series resonators S3 and S4 and the parallel resonators P2 and P3 into the first divided resonators S3a, S4a, P2a, and P3a and the second divided resonators S3b, S4b, P2b, and P3b connected in parallel so that the electrodes in the c-axis orientation direction of the piezoelectric substance 24 are at opposite electric potentials. This configuration allows the secondary distortion voltages to cancel out each other, reducing the secondary distortion. Moreover, the first resonator group 12, which includes the first divided resonators S3a, S4a, P2a, and P3a, and the second resonator group 14, which includes the second divided resonators S3b, S4b, P2b, and P3b, are connected in parallel to each other between the nodes N1 and N2. The first divided resonators S3a and S4a and the second divided resonators S3b and S4b of the series resonators S3 and S4 are not electrically interconnected at other than the nodes N1 and N2. This configuration reduces the number of the connection switching portions 32 to two, and inhibits the filter from increasing in size.

Fourth Embodiment

Figure 13:
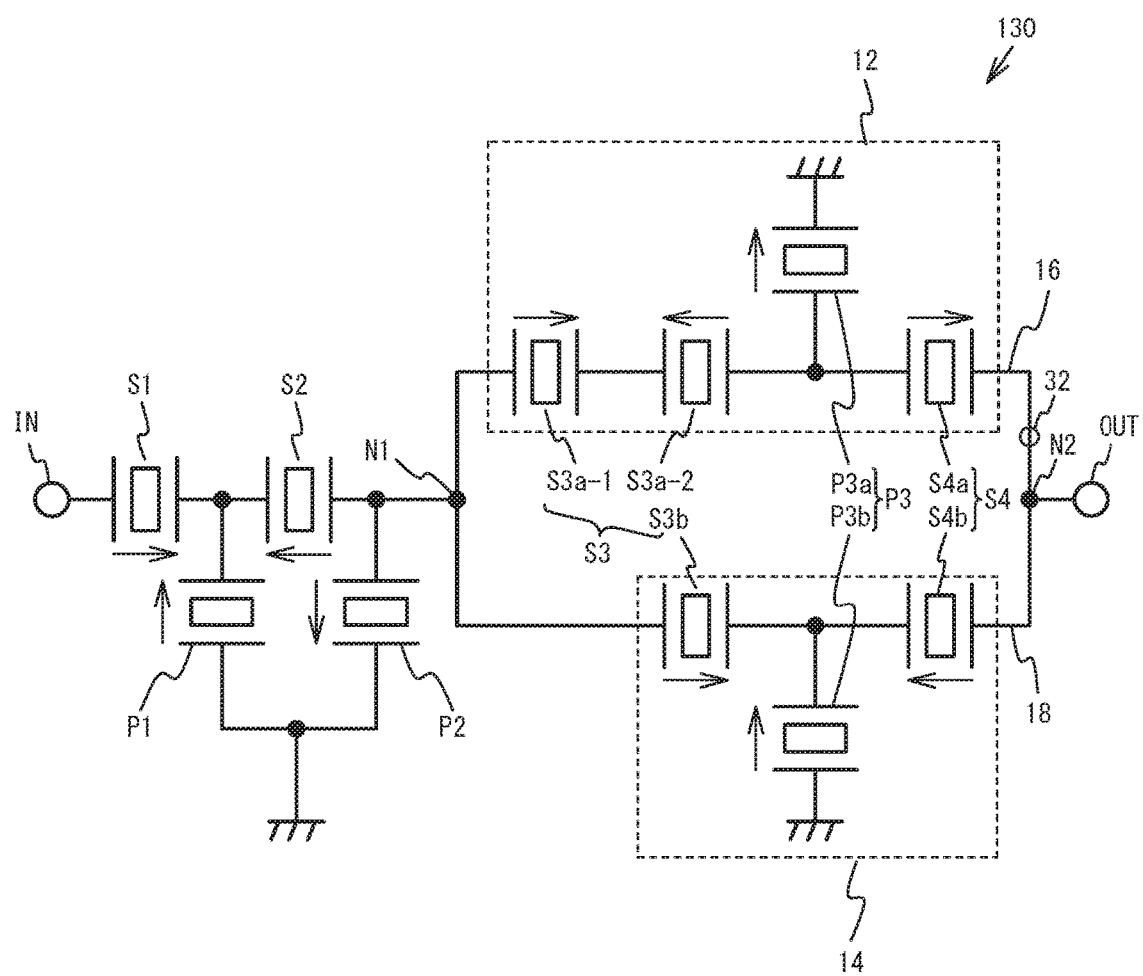
FIG. 13 illustrates a ladder-type filter in accordance with a fourth embodiment.

FIG. 13 illustrates a ladder-type filter 130 in accordance with a fourth embodiment. As illustrated in FIG. 13, the ladder-type filter 130 of the fourth embodiment differs from the ladder-type filter 120 of the third embodiment in that the first divided resonator S3a is serially divided into two resonators S3a-1 and S3a-2. The resonators S3a-1 and S3a-2 are connected so that the secondary distortion voltages are generated in opposite directions. The connection switching portion 32 is formed between the series resonator S4 and the output terminal OUT, but is not formed between the series resonators S2 and S3. Other configurations are the same as or similar to those of the third embodiment, and thus the description is omitted.

Figure 14:
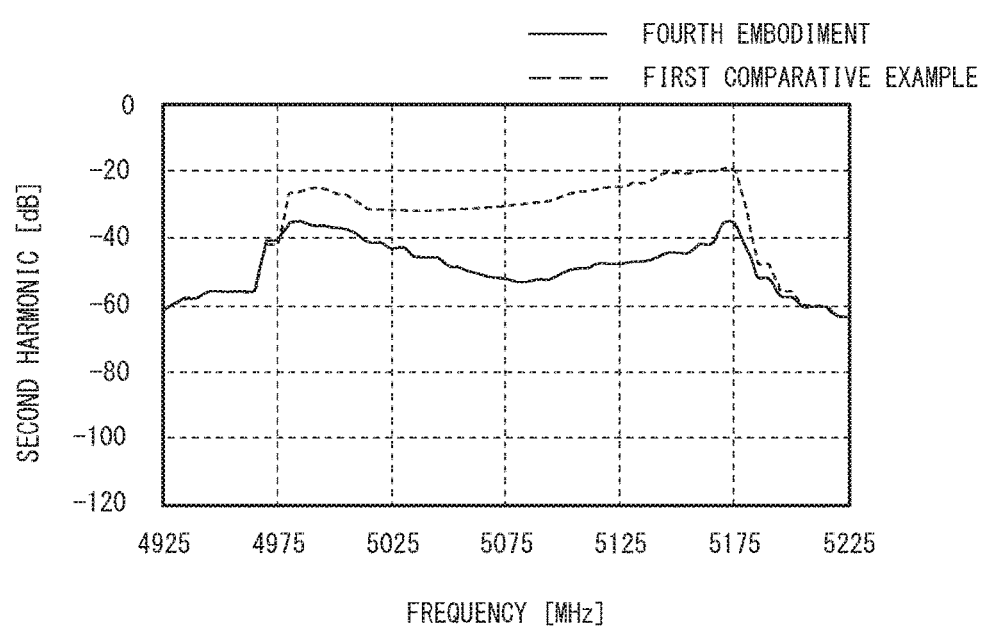
FIG. 14 illustrates the simulation result of the secondary distortion of the ladder-type filter of the fourth embodiment.

FIG. 14 illustrates the simulation result of the secondary distortion of the ladder-type filter 130 of the fourth embodiment. For comparison, the simulation result of the ladder-type filter 500 of the first comparative example is also presented. The simulation was conducted with use of parameters listed in Table 1 as in the case of FIG. 6. Each of the resonators S3a-1 and S3a-2 was configured to have an electrostatic capacitance twice the electrostatic capacitance of the divided resonator S3a, and a resonant frequency equal to the resonant frequency of the divided resonator S3a. As illustrated in FIG. 14, the fourth embodiment reduces the second harmonic compared with the first comparative example.

Figure 15:
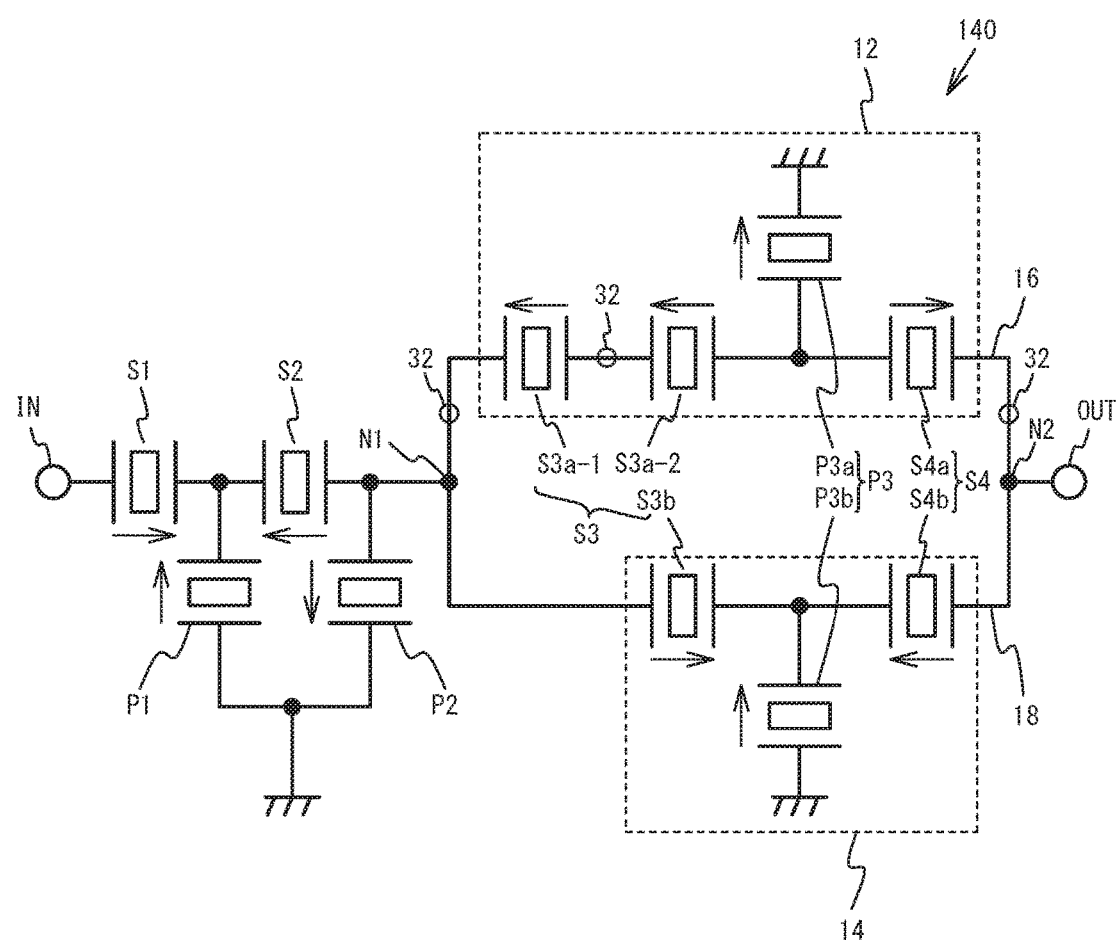
FIG. 15 illustrates a ladder-type filter in accordance with a first variation of the fourth embodiment.

FIG. 15 illustrates a ladder-type filter 140 in accordance with a first variation of the fourth embodiment. As illustrated in FIG. 15, in the ladder-type filter 140 of the first variation of the fourth embodiment, the resonators S3a-1 and S3a-2 are connected so that secondary distortion voltages are generated in the same direction. Accordingly, the connection switching portion 32 is formed between the resonators S3a-1 and S3a-2. Other configurations are the same as or similar to those of the fourth embodiment, and thus the description is omitted.

Figure 16:
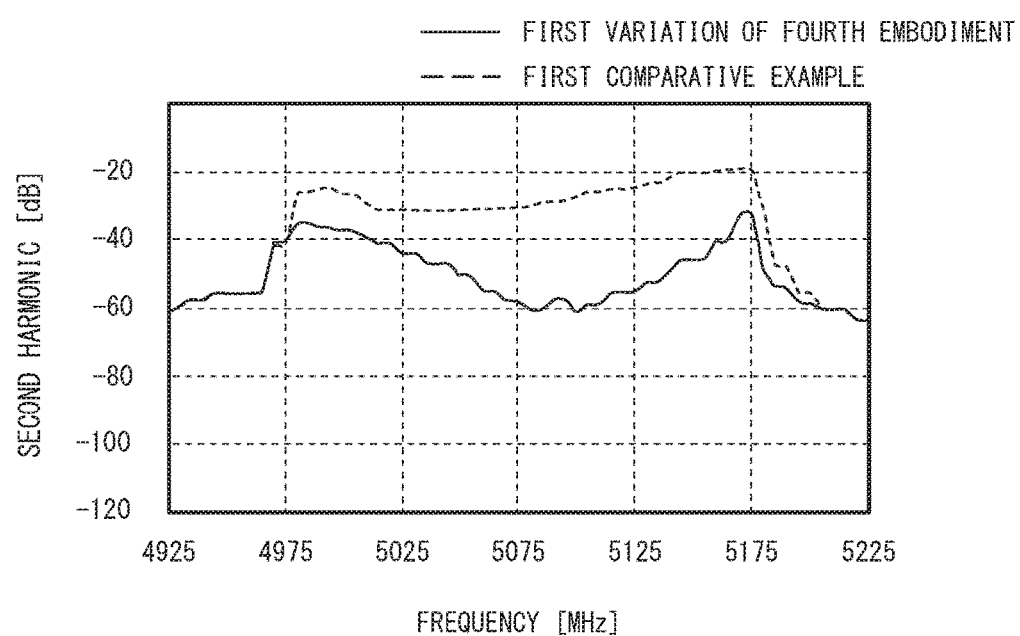
FIG. 16 illustrates the simulation result of the secondary distortion of the ladder-type filter in accordance with the first variation of the fourth embodiment.

FIG. 16 illustrates the simulation result of the secondary distortion of the ladder-type filter 140 of the first variation of the fourth embodiment. For comparison, the simulation result of the ladder-type filter 500 of the first comparative example is also presented. The simulation was conducted with use of parameters listed in Table 1 as in the case of FIG. 6. The each of the resonators S3a-1 and S3a-2 was configured to have an electrostatic capacitance twice the electrostatic capacitance of the divided resonator S3a, and a resonant frequency equal to the resonant frequency of the divided resonator S3a. As illustrated in FIG. 16, the first variation of the fourth embodiment reduces the second harmonic compared with the first comparative example.

As in the fourth embodiment and in the first variation of the fourth embodiment, the first divided resonator S3a of the series resonator S3 may be further divided into two resonators S3a-1 and S3a-2. The directions of the secondary distortion voltages of the resonators S3a-1 and S3a-2 may be opposite directions or the same direction.

Fifth Embodiment

Figure 17:
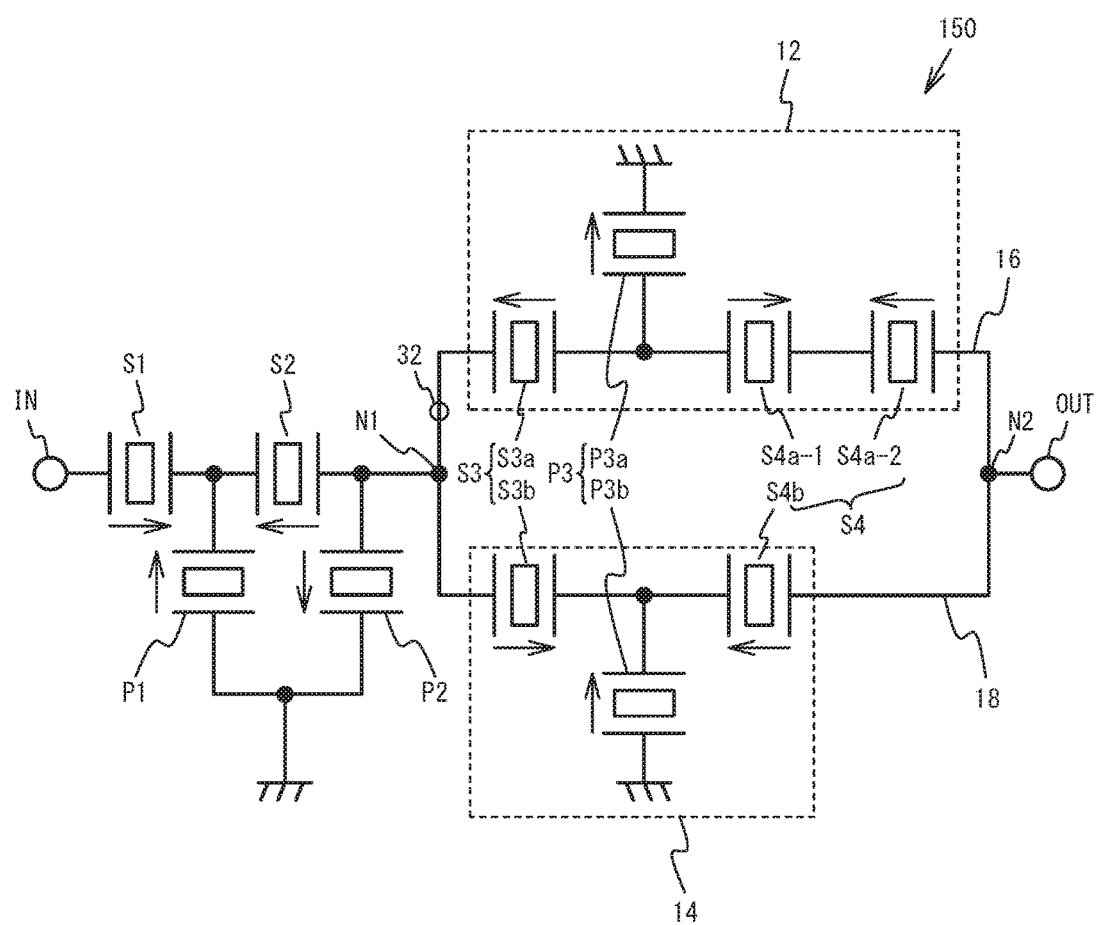
FIG. 17 illustrates a ladder-type filter in accordance with a fifth embodiment.

FIG. 17 illustrates a ladder-type filter 150 in accordance with a fifth embodiment. As illustrated in FIG. 17, the ladder-type filter 150 of the fifth embodiment differs from the ladder-type filter 120 of the third embodiment in that the first divided resonator S4a is serially divided into two resonators S4a-1 and S4a-2. The resonators S4a-1 and S4a-2 are connected so that the secondary distortion voltages are generated in opposite directions. The connection switching portion 32 is formed between the series resonators S2 and S3, but is not formed between the series resonator S4 and the output terminal OUT. Other configurations are the same as or similar to those of the third embodiment, and thus the description is omitted.

Figure 18:
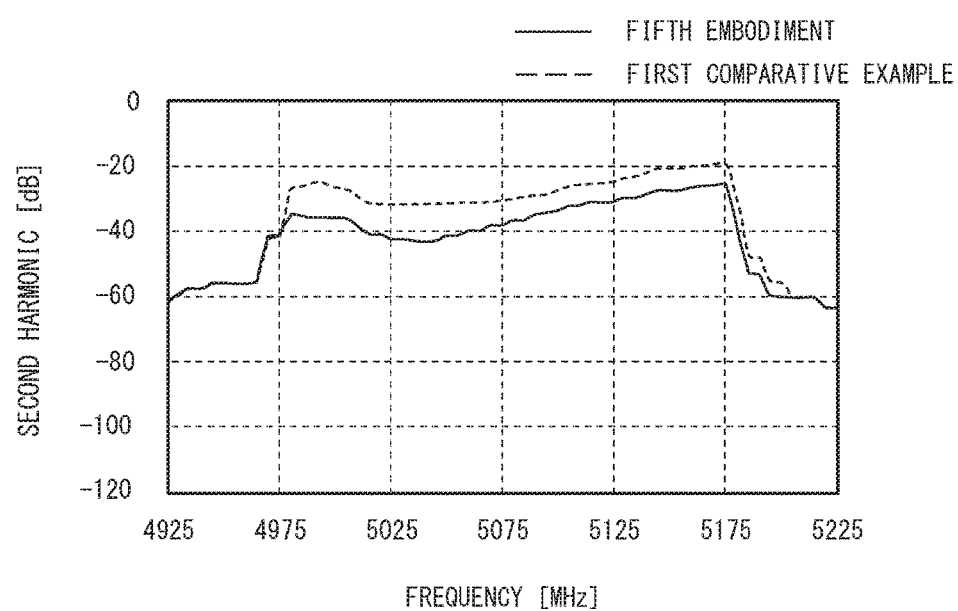
FIG. 18 illustrates the simulation result of the secondary distortion of the ladder-type filter of the fifth embodiment.

FIG. 18 illustrates the simulation result of the secondary distortion of the ladder-type filter 150 of the fifth embodiment. For comparison, the simulation result of the ladder-type filter 500 of the first comparative example is also presented. The simulation was conducted with use of parameters listed in Table 1 as in the case of FIG. 6. Each of the resonators S4a-1 and S4a-2 was configured to have an electrostatic capacitance twice the electrostatic capacitance of the divided resonator S4a, and a resonant frequency equal to the resonant frequency of the divided resonator S4a. As illustrated in FIG. 18, the fifth embodiment reduces the second harmonic compared with the first comparative example.

Figure 19:
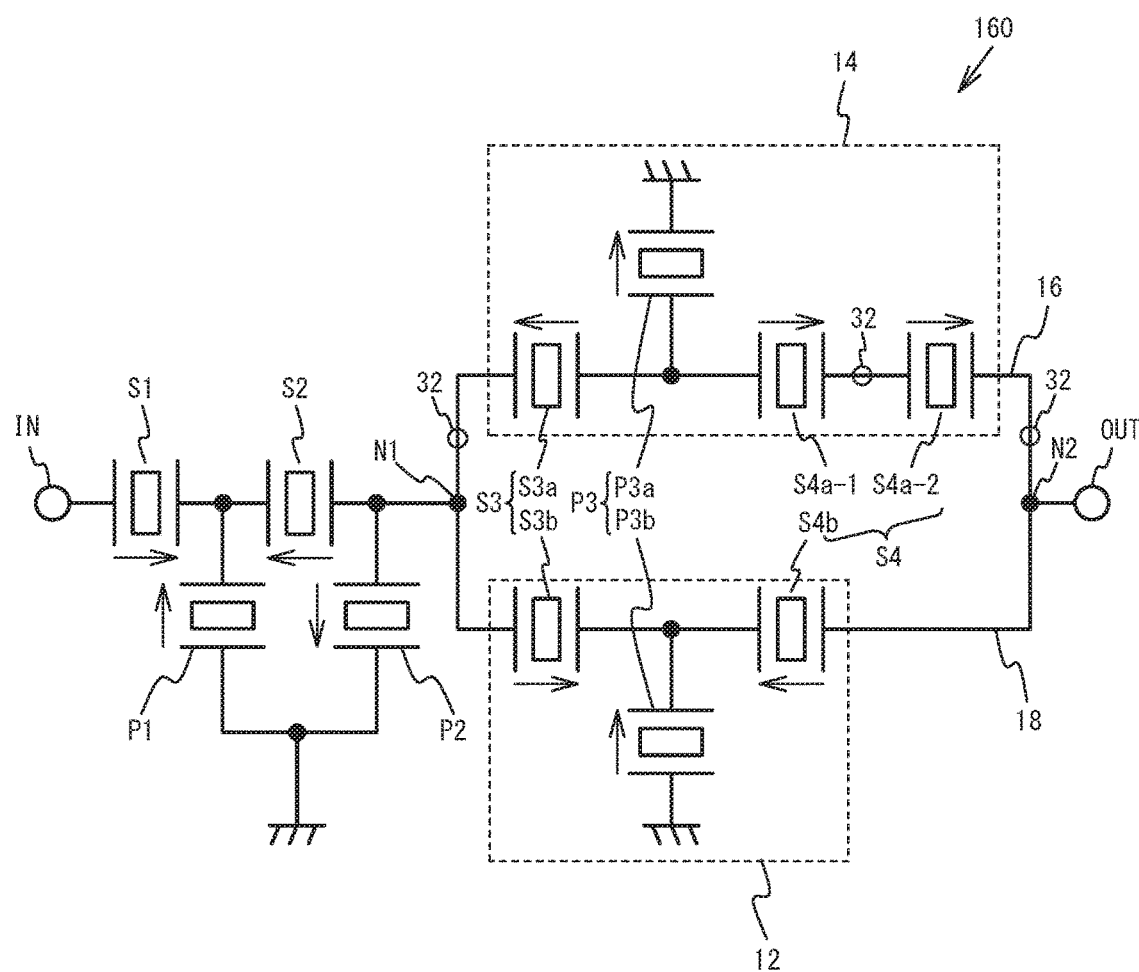
FIG. 19 illustrates a ladder-type filter in accordance with a first variation of the fifth embodiment.

FIG. 19 illustrates a ladder-type filter 160 in accordance with a first variation of the fifth embodiment. As illustrated in FIG. 19, in the ladder-type filter 160 of the first variation of the fifth embodiment, the resonators S4a-1 and S4a-2 are connected so that the secondary distortion voltages are generated in the same direction. Thus, the connection switching portion 32 is formed between the resonators S4a-1 and S4a-2. Other configurations are the same as or similar to those of the fifth embodiment, and thus the description is omitted.

Figure 20:
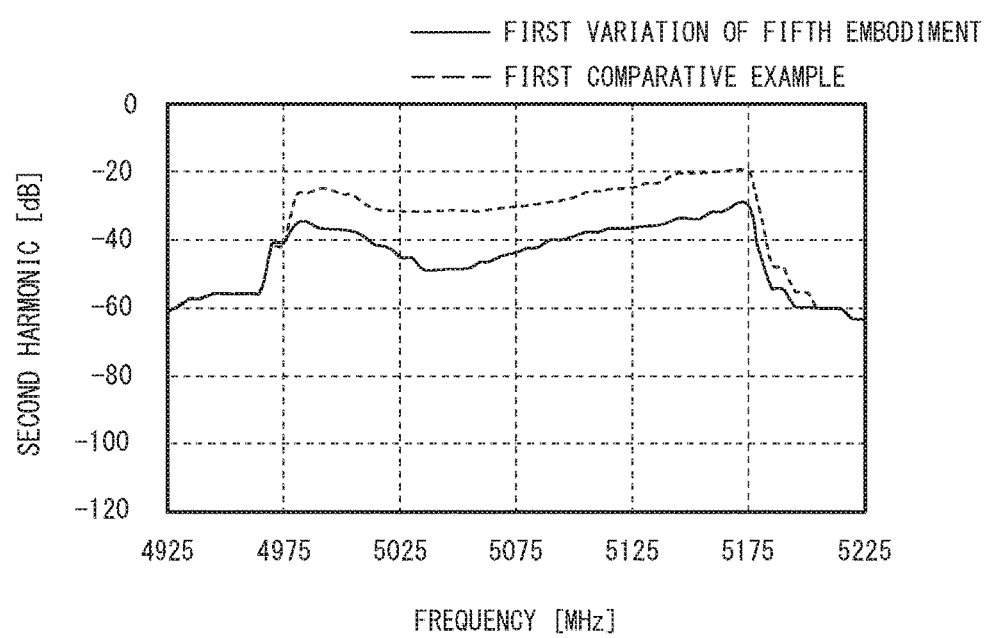
FIG. 20 illustrates the simulation result of the secondary distortion of the ladder-type filter of the first variation of the fifth embodiment.

FIG. 20 illustrates the simulation result of the secondary distortion of the ladder-type filter 160 of the first variation of the fifth embodiment. For comparison, the simulation result of the ladder-type filter 500 of the first comparative example is also presented. The simulation was conducted with use of parameters listed in Table 1 as in the case of FIG. 6. Each of the resonators S4a-1 and S4a-2 was configured to have an electrostatic capacitance twice the electrostatic capacitance of the divided resonator S4a, and a resonant frequency equal to the resonant frequency of the divided resonator S4a. As illustrated in FIG. 20, the first variation of the fifth embodiment reduces the second harmonic compared with the first comparative example.

As in the fifth embodiment and in the first variation of the fifth embodiment, the first divided resonator S4a of the series resonator S4 may be further divided into two resonators S4a-1 and S4a-2. The directions of the secondary distortion voltages of the resonators S4a-1 and S4a-2 may be opposite directions or the same direction.

Sixth Embodiment

Figure 21:
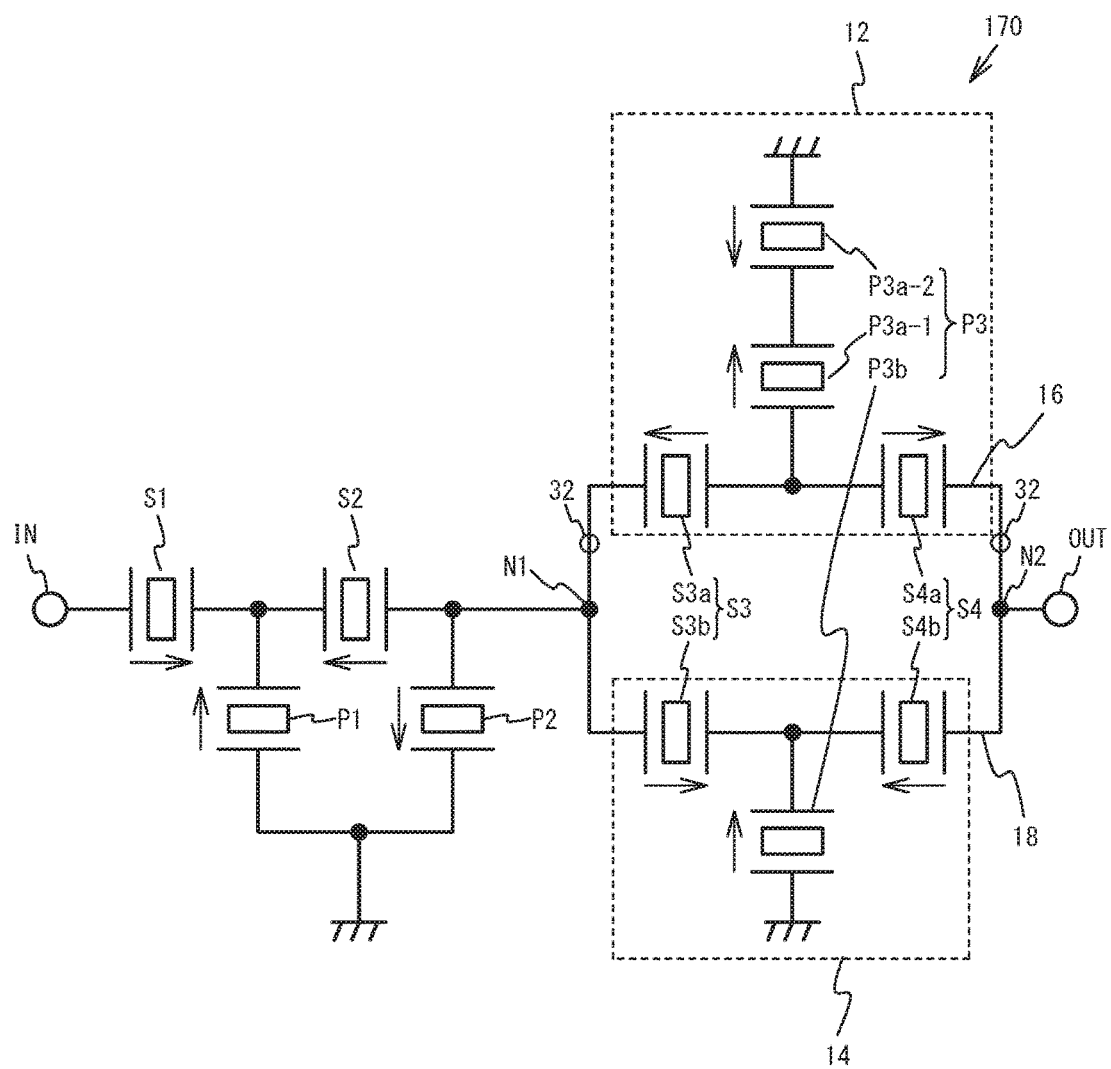
FIG. 21 illustrates a ladder-type filter in accordance with a sixth embodiment.

FIG. 21 illustrates a ladder-type filter 170 in accordance with a sixth embodiment. As illustrated in FIG. 21, the ladder-type filter 170 of the sixth embodiment differs from the ladder-type filter 120 of the third embodiment in that the first divided resonator P3a is serially divided into two resonators P3a-1 and P3a-2. The resonators P3a-1 and P3a-2 are connected so that the secondary distortion voltages are generated in opposite directions. Other configurations are the same as or similar to those of the third embodiment, and thus the description is omitted.

Figure 22:
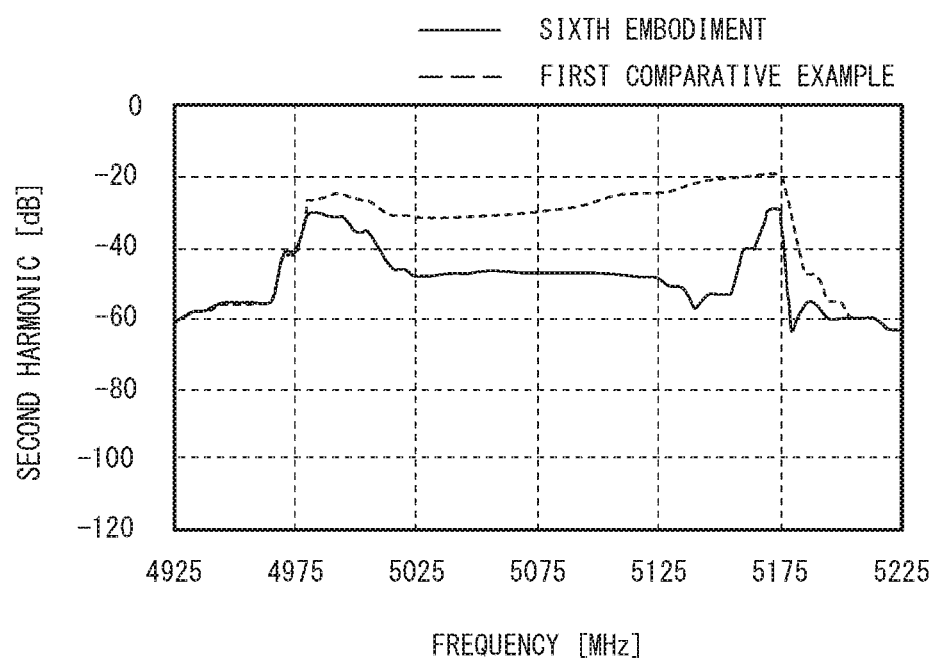
FIG. 22 illustrates the simulation result of the secondary distortion of the ladder-type filter of the sixth embodiment.

FIG. 22 illustrates the simulation result of the secondary distortion of the ladder-type filter 170 of the sixth embodiment. For comparison, the simulation result of the ladder-type filter 500 of the first comparative example is also presented. The simulation was conducted with use of parameters listed in Table 1 as in the case of FIG. 6. Each of the resonators P3a-1 and P3a-2 was configured to have an electrostatic capacitance twice the electrostatic capacitance of the divided resonator P3a, and a resonant frequency equal to the resonant frequency of the divided resonator P3a. As illustrated in FIG. 22, the sixth embodiment reduces the second harmonic compared to the first comparative example.

Figure 23:
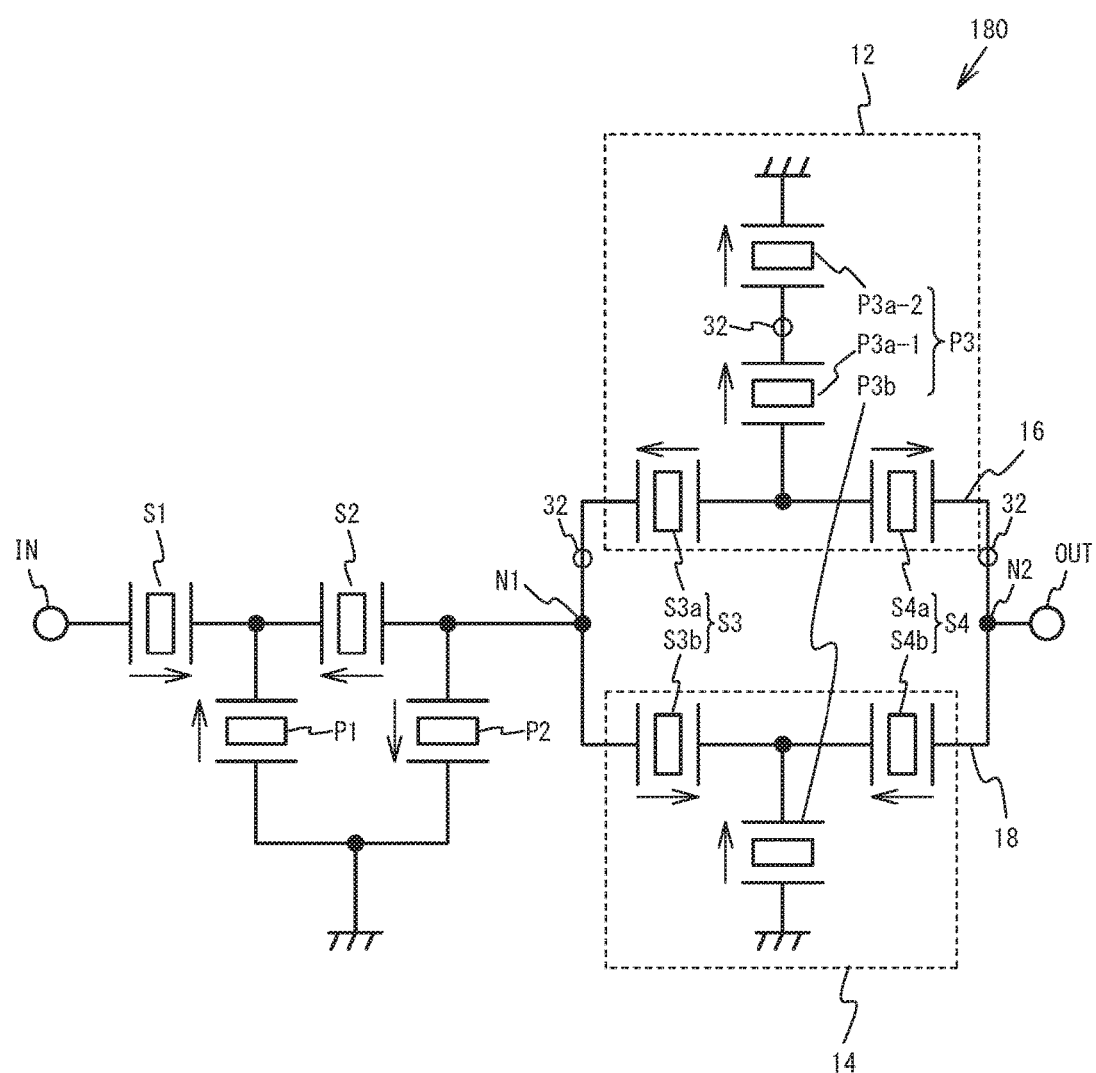
FIG. 23 illustrates a ladder-type filter in accordance with a first variation of the sixth embodiment.

FIG. 23 illustrates a ladder-type filter 180 in accordance with a first variation of the sixth embodiment. As illustrated in FIG. 23, in the ladder-type filter 180 of the first variation of the sixth embodiment, the resonators P3a-1 and P3a-2 are connected so that the secondary distortion voltages are generated in the same direction. Accordingly, the connection switching portion 32 is formed between the resonators P3a-1 and P3a-2. Other configurations are the same as or similar to the sixth embodiment, and thus the description is omitted.

Figure 24:
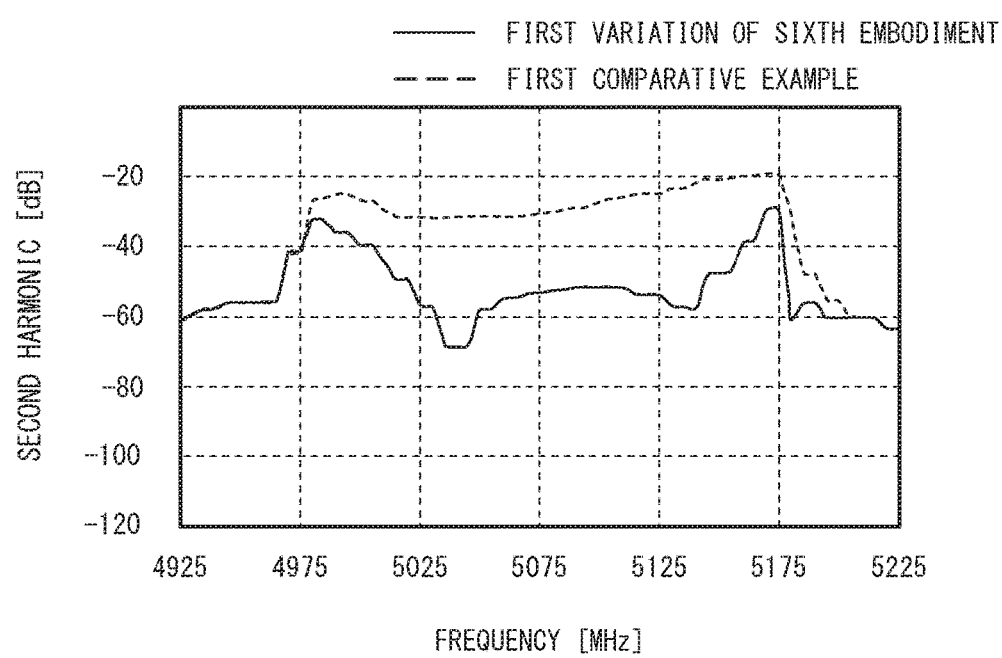
FIG. 24 illustrates the simulation result of the secondary distortion of the ladder-type filter of the first variation of the sixth embodiment.

FIG. 24 illustrates the simulation result of the secondary distortion of the ladder-type filter 180 of the first variation of the sixth embodiment. For comparison, the simulation result of the ladder-type filter 500 of the first comparative example is also presented. The simulation was conducted with use of parameters listed in Table 1 as in the case of FIG. 6. Each of the resonators P3a-1 and P3a-2 was configured to have an electrostatic capacitance twice the electrostatic capacitance of the divided resonator P3a, and a resonant frequency equal to the resonant frequency of the divided resonator P3a. As illustrated in FIG. 24, the first variation of the sixth embodiment reduces second harmonic compared with the first comparative example.

As in the sixth embodiment and in the first variation of the sixth embodiment, the first divided resonator P3a of the parallel resonator P3 may be further divided into two resonators P3a-1 and P3a-2. The directions of the secondary distortion voltages of the resonators P3a-1 and P3a-2 may be opposite directions or the same direction.

As in the fourth through sixth embodiments, the first divided resonator may be further divided into two in at least one of the series resonator and the parallel resonator divided into the first divided resonator and the second divided resonator. Alternatively, the second divided resonator may be further divided into two.

As in the first through sixth embodiments, when at least two series resonators and a parallel resonator between the at least two resonators among two or more series resonators and one or more parallel resonators are divided into the first divided resonators and the second divided resonators connected in parallel so that the electrodes in the c-axis orientation direction of the piezoelectric substance 24 are at opposite electric potentials, the secondary distortion is reduced. Moreover, when the first resonator group 12 including the first divided resonators and the second resonator group 14 including the second divided resonators are connected in parallel between the nodes N1 and N2, and the first divided resonators and the second divided resonators of the at least two series resonators are not electrically interconnected at other than the nodes N1 and N2, the filter is inhibited from increasing in size.

In addition, as in the first embodiment, when all of two or more series resonators S1 through S4 and all of one or more parallel resonators P1 through P3 are divided into the first divided resonators and the second divided resonators, the filter is inhibited from increasing in size, and the secondary distortion is effectively reduced.

Seventh Embodiment

Figure 25:
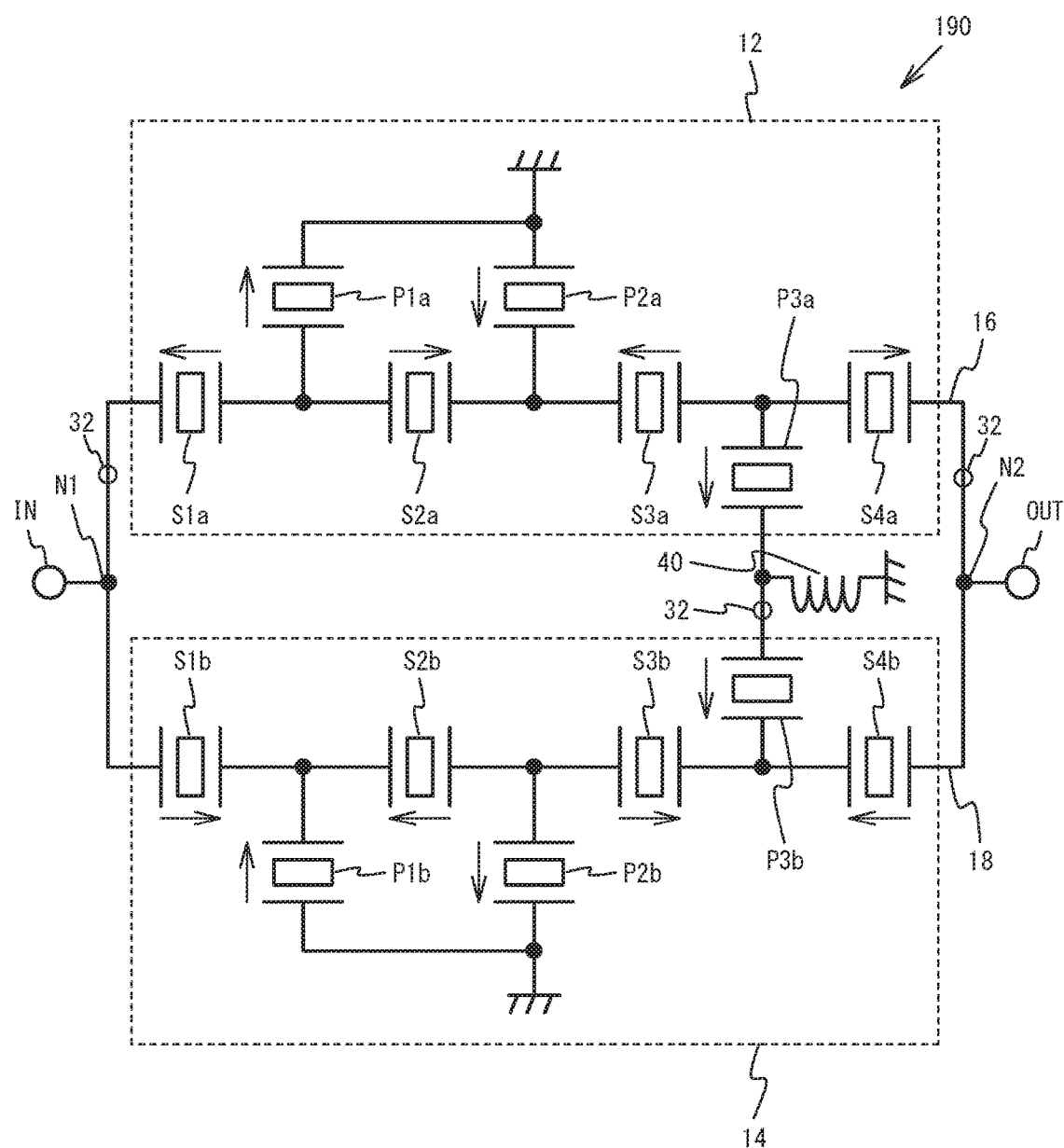
FIG. 25 illustrates a ladder-type filter in accordance with a seventh embodiment.

FIG. 25 illustrates a ladder-type filter 190 in accordance with a seventh embodiment. As illustrated in FIG. 25, in the ladder-type filter 190 of the seventh embodiment, an inductor 40 is connected between the first and second divided resonators P3a and P3b, which is divided in parallel from the parallel resonator P3, and a ground. The parallel resonator P3 forms an attenuation pole in a frequency band twice the passband of the ladder-type filter 190 by the inductor 40. Other configurations are the same as or similar to those of the first embodiment, and thus the description is omitted.

The seventh embodiment divides the parallel resonator P3 closest to the output terminal OUT into the first and second divided resonators P3a and P3b, and connects the inductor 40 in series between the first and second divided resonators P3a and P3b and ground. The parallel resonator P3 forms an attenuation pole in a frequency band twice the passband of the ladder-type filter 190. This configuration further reduces the secondary distortion.

Eighth Embodiment

Figure 26:
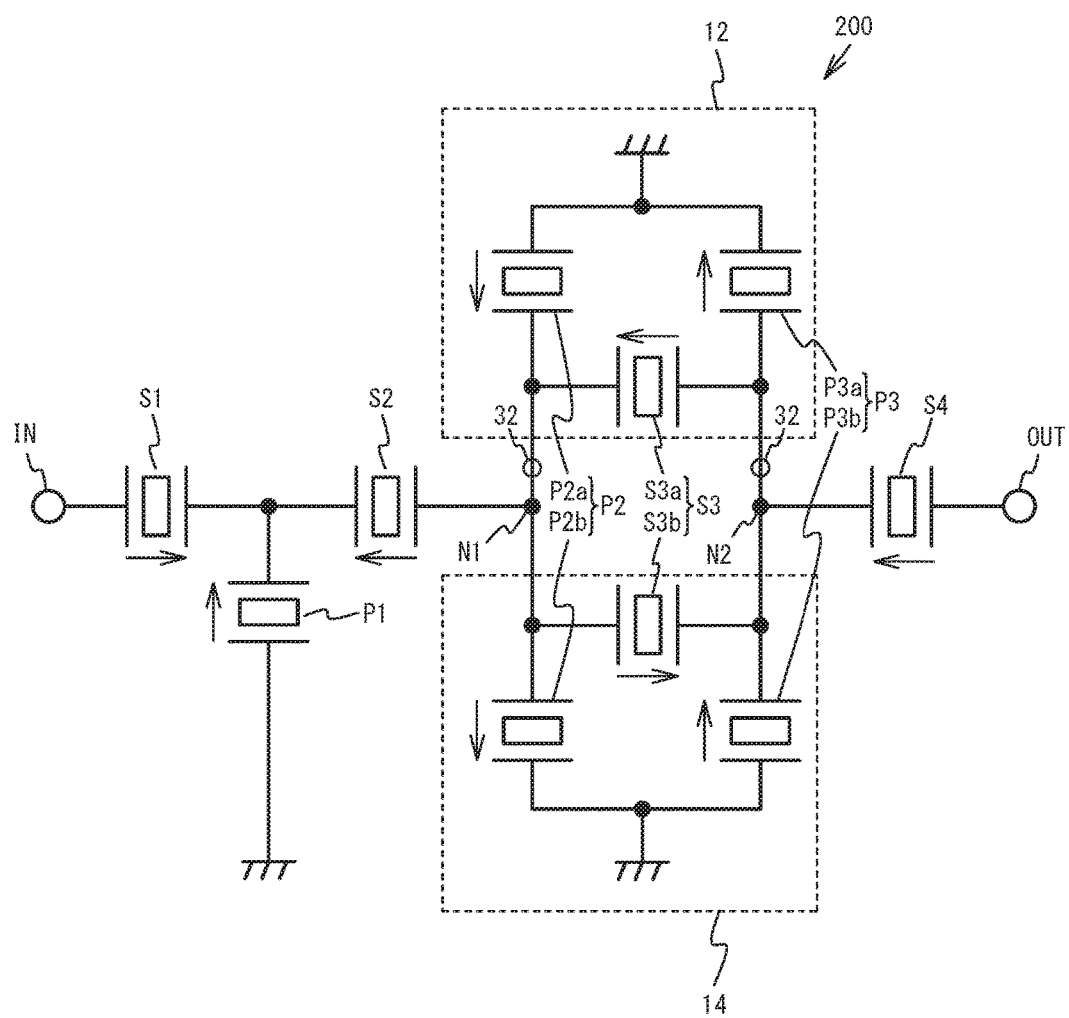
FIG. 26 illustrates a ladder-type filter in accordance with an eighth embodiment.

FIG. 26 illustrates a ladder-type filter 200 in accordance with an eighth embodiment. As illustrated in FIG. 26, in the ladder-type filter 200 of the eighth embodiment, the series resonator S3 and the parallel resonators P2 and P3 are divided in parallel, and the series resonators S1, S2, and S4 and the parallel resonator P1 are not divided. The first resonator group 12, which includes the first divided resonators S3a, P2a, and P3a, and the second resonator group 14, which includes the second divided resonators S3b, P2b, and P3b, are connected in parallel between the nodes N1, which is closer to the input terminal IN than the first and second resonator groups 12 and 14, and the node N2, which is closer to the output terminal OUT than the first and second resonator groups 12 and 14. The first and second divided resonators S3a and S3b of the series resonator S3 are not electrically interconnected at other than the nodes N1 and N2. Other configurations are the same as or similar to those of the first embodiment, and thus the description is omitted.

Figure 27:
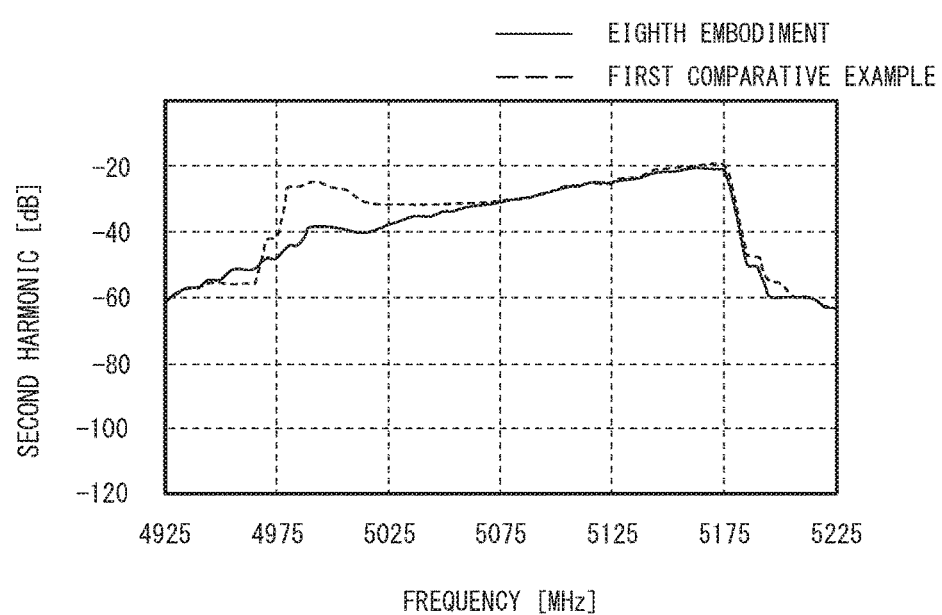
FIG. 27 illustrates the simulation result of the secondary distortion of the ladder-type filter of the eighth embodiment.

FIG. 27 illustrates the simulation result of the secondary distortion of the ladder-type filter 200 of the eighth embodiment. For comparison, the simulation result of the ladder-type filter 500 of the first comparative example is also presented. The simulation was conducted with use of parameters listed in Table 1 as in the case of FIG. 6. As illustrated in FIG. 27, the eighth embodiment reduces the second harmonic compared with the first comparative example.

As described above, the eighth embodiment divides the series resonator S3 and the parallel resonators P2 and P3 into the first divided resonators S3a, P2a, and P3a and the second divided resonator S3b, P2b, and P3b connected in parallel so that the electrodes in the c-axis orientation direction of the piezoelectric substance 24 are at opposite electric potentials. This configuration allows the secondary distortion voltages to cancel out each other, reducing the secondary distortion.

Figure 28:
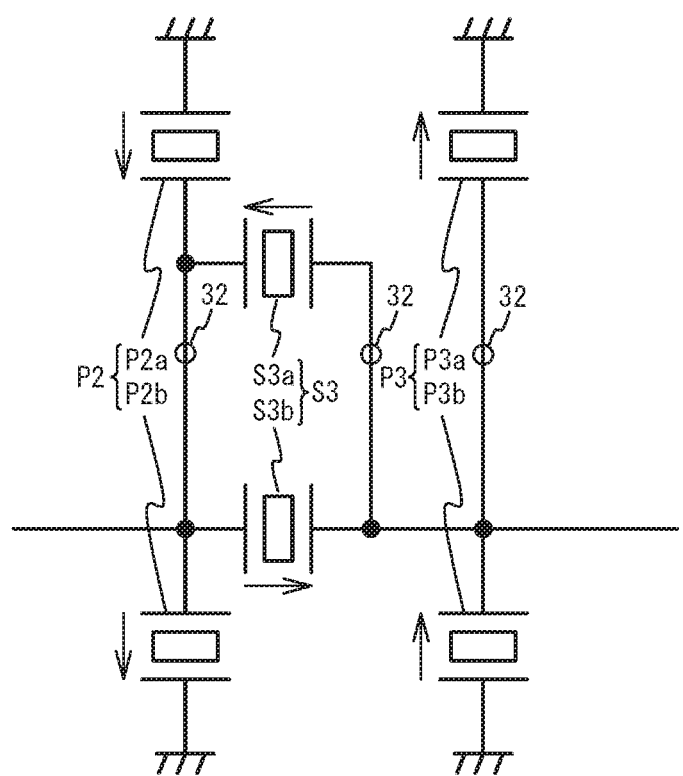
FIG. 28 illustrates a case where two parallel resonators and a series resonator between the two parallel resonators are divided in parallel in the same manner as in the second comparative example.

FIG. 28 illustrates a case where two parallel resonators P2 and P3 and the series resonator S3 between the parallel resonators P2 and P3 are divided in parallel by the method same as that of the second comparative example. As illustrated in FIG. 28, when two parallel resonators P2 and P3 and the series resonator S3 between the parallel resonators P2 and P3 are divided in parallel in the same manner as in the second comparative example, three connection switching portions 32 are formed.

In contrast, in the eighth embodiment, the first resonator group 12, which includes the first divided resonators S3a, P2a, and P3a, and the second resonator group 14, which includes the second divided resonators S3b, P2b, and P3b, are connected in parallel to each other between the nodes N1 and N2. The first and second divided resonators S3a and S3b of the series resonator S3 are not electrically interconnected at other than the nodes N1 and N2. This configuration reduces the number of the connection switching portions 32 to two, and inhibits the filter from increasing in size.

Figure 29:
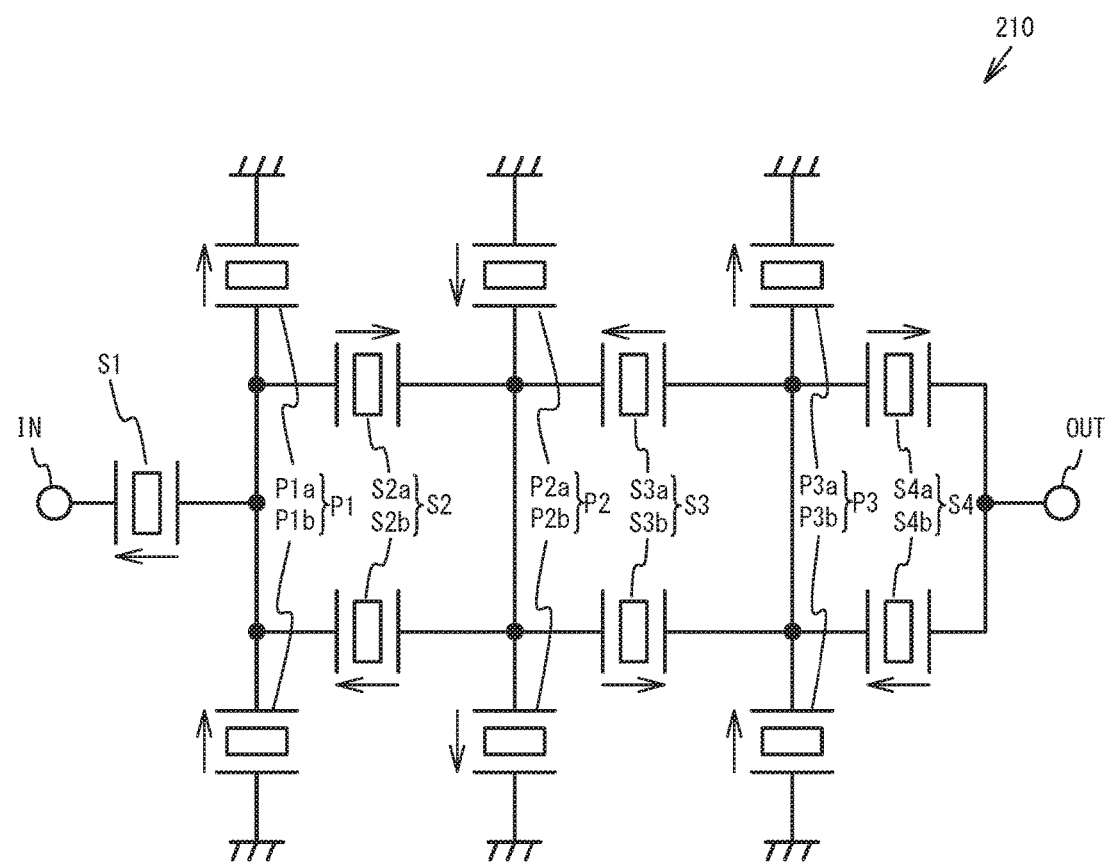
FIG. 29 illustrates a ladder-type filter in accordance with a first variation of the eighth embodiment.
Figure 30:
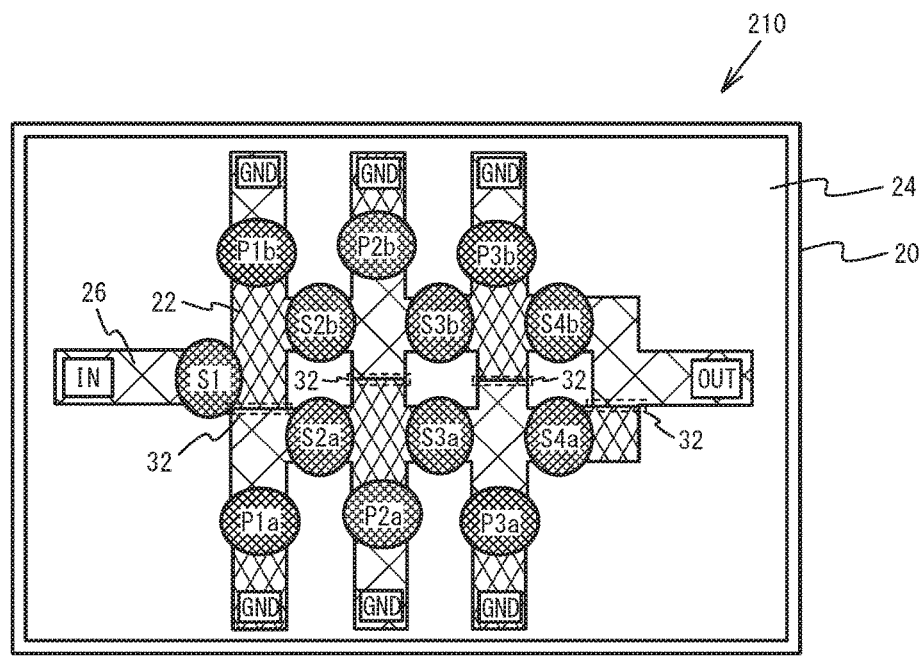
FIG. 30 is a top view of a ladder-type filter in accordance with the first variation of the eighth embodiment.

FIG. 29 illustrates a ladder-type filter 210 in accordance with a first variation of the eighth embodiment. FIG. 30 is a top view of the ladder-type filter 210 of the first variation of the eighth embodiment. As illustrated in FIG. 29 and FIG. 30, the ladder-type filter 210 of the first variation of the eighth embodiment differs from the ladder-type filter 200 of the eighth embodiment in that the series resonators S2 and S4 and the parallel resonator P1 are divided in parallel in addition to the series resonator S3 and the parallel resonators P2 and P3. Other configurations are the same as or similar to those of the eighth embodiment, and thus the description is omitted.

The first through eighth embodiments divide the series resonator and/or the parallel resonator into two divided resonators, but may divide the series resonator and/or the parallel resonator into three or more divided resonators. The piezoelectric substance may be a substance other than aluminum nitride and zinc oxide. When a piezoelectric substance other than aluminum nitride and zinc oxide is used, the c-axis orientation may be replaced by a polarization axis to reduce the secondary distortion in the first through eighth embodiments.

Ninth Embodiment

Figure 31:
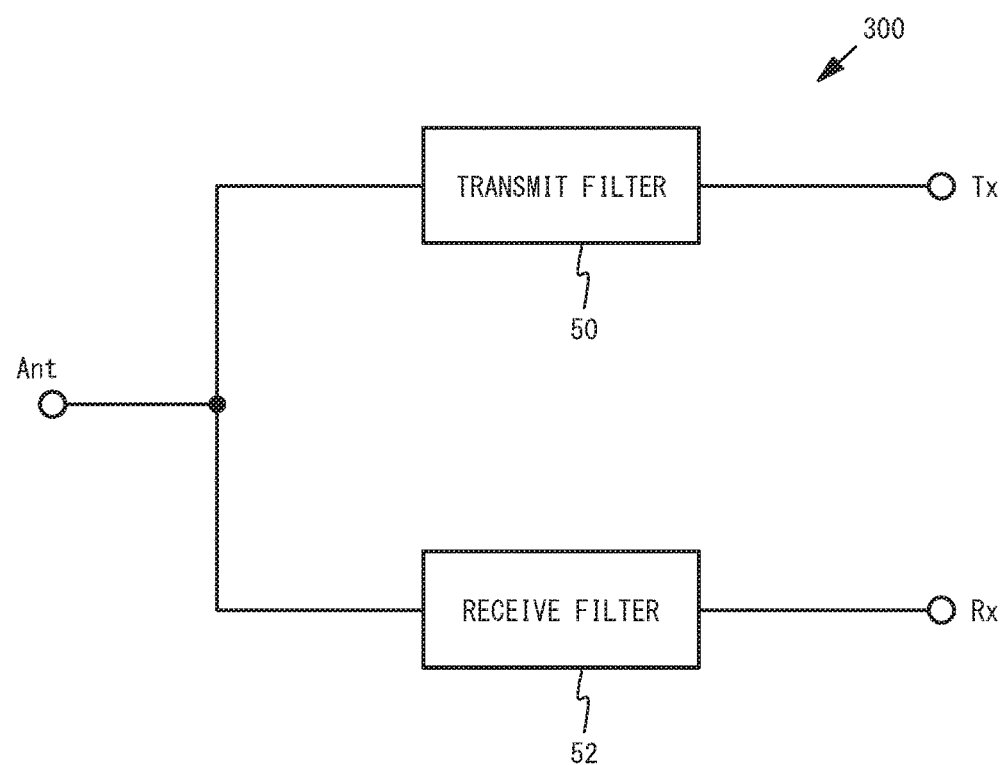
FIG. 31 is a block diagram of a duplexer in accordance with a ninth embodiment.

FIG. 31 is a block diagram of a duplexer 300 in accordance with a ninth embodiment. As illustrated in FIG. 31, the duplexer 300 of the ninth embodiment includes a transmit filter 50 and a receive filter 52. The transmit filter 50 is connected between an antenna terminal Ant and a transmit terminal Tx. The receive filter 52 is connected between the antenna terminal Ant shared with the transmit filter 50 and a receive terminal Rx.

The transmit filter 50 transmits signals in the transmit band, among signals input from the transmit terminal Tx, to the antenna terminal Ant as a transmission signal, and suppresses signals with other frequencies. The receive filter 52 transmits signals in the receive band, among signals input from the antenna terminal Ant, to the receive terminal Rx as a reception signal, and suppresses signals with other frequencies. The frequency of the transmit band differs from the frequency of the receive band. A matching circuit that matches impedance may be provided so that the transmission signal passing through the transmit filter 50 is output from the antenna terminal Ant without leaking to the receive filter 52.

At least one of the transmit filter 50 and the receive filter 52 included in the duplexer 300 of the ninth embodiment may be the ladder-type filter according to any one of the first through eighth embodiments.

Tenth Embodiment

Figure 32:
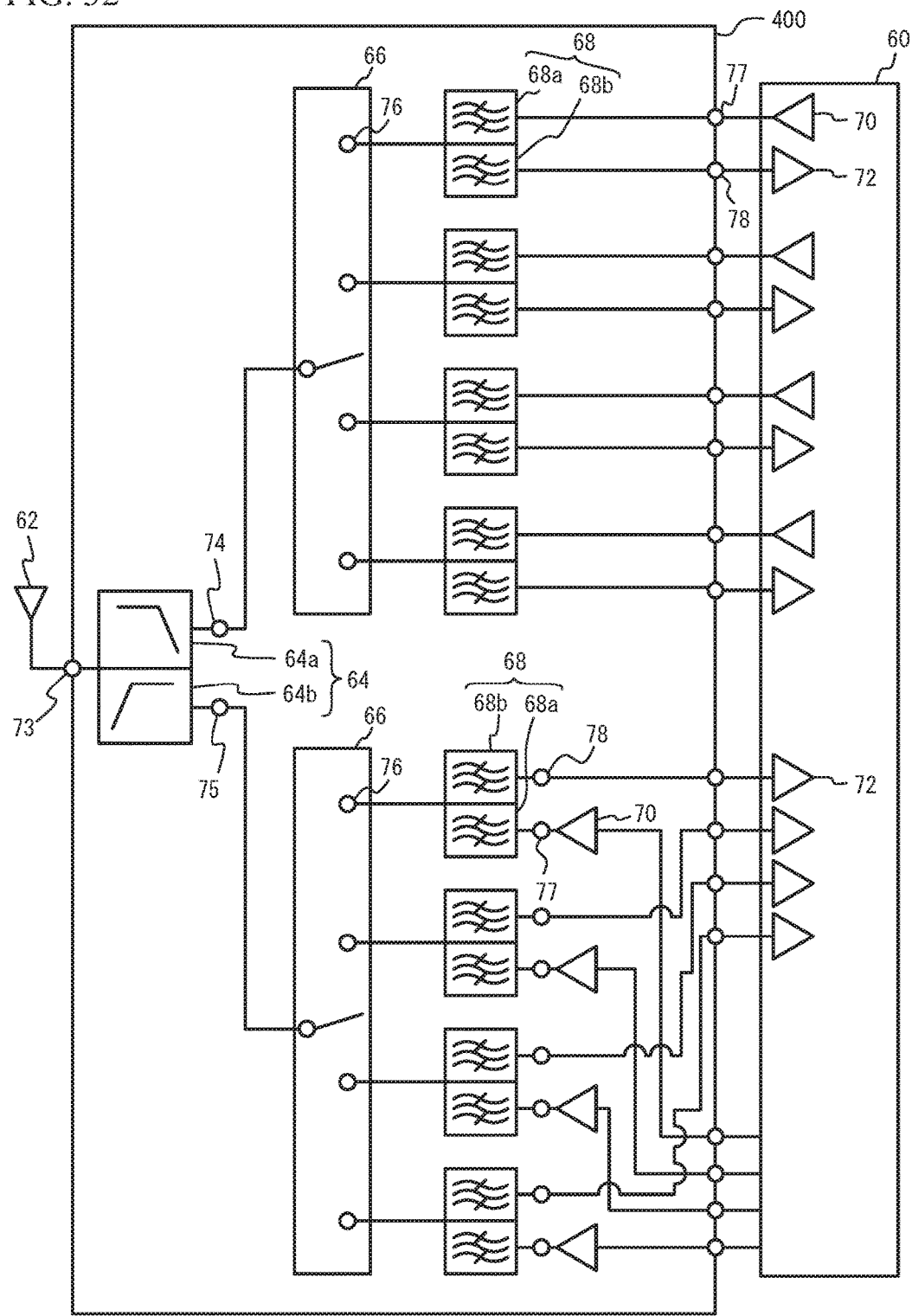
FIG. 32 is a block diagram of a mobile communication device including a module in accordance with a tenth embodiment.

FIG. 32 is a block diagram of a mobile communication device including a module 400 in accordance with a tenth embodiment. As illustrated in FIG. 32, the mobile communication device includes the module 400 that is a transceiver device, an integrated circuit 60, and an antenna 62. The module 400 includes a diplexer 64, switches 66, duplexers 68, and power amplifiers 70. The diplexer 64 includes a low-pass filter (LPF) 64a and a high-pass filter (HPF) 64b. The LPF 64a is connected between terminals 73 and 74. The HPF 64b is connected between terminals 73 and 75. The terminal 73 is connected to the antenna 62. The LPF 64a allows low-frequency signals of signals received by/transmitted from the antenna 62 to pass therethrough, and suppresses high-frequency signals. The HPF 64b allows high-frequency signals of signals received by/transmitted from the antenna 62 to pass therethrough, and suppresses low-frequency signals.

The switch 66 connects the terminals 74 and 75 to one of the terminals 76. The duplexer 68 includes a transmit filter 68a and a receive filter 68b. The transmit filter 68a is connected between terminals 76 and 77. The receive filter 68b is connected between terminals 76 and 78. The transmit filter 68a allows signals in the transmit band to pass therethrough, and suppresses other signals. The receive filter 68b allows signals in the receive band to pass therethrough, and suppresses other signals. The power amplifier 70 amplifies and outputs the transmission signal to the terminal 77. A low noise amplifier 72 amplifies the reception signal output to the terminal 78.

The module 400 that is the transceiver device may use the ladder-type filter according to any one of the first through eighth embodiments as the transmit filter 68a or the receive filter 68b of the duplexer 68. The module 400 may include the power amplifier 70 and/or the low noise amplifier 72.

As described above, the ladder-type filters of the first through eighth embodiments can form a transceiver device that is connected to the antenna 62 and mounted on a motherboard together with the power amplifier 70, and transmits and receives communication signals.

Although the embodiments of the present invention have been described in detail, it is to be understood that the various change, substitutions, and alterations could be made hereto without departing from the spirit and scope of the invention.

What is claimed is:

1. An acoustic wave filter comprising:
two or more series resonators connected in series between an input terminal and an output terminal and formed of a piezoelectric thin film resonator; and
one or more parallel resonators connected in parallel between the input terminal and the output terminal and formed of a piezoelectric thin film resonator,
wherein each of at least two series resonators and a parallel resonator between the at least two series resonators among the two or more series resonators and the one or more parallel resonators is divided into a first divided resonator and a second divided resonator, the first divided resonator including a piezoelectric substance sandwiched between a pair of electrodes in a direction of a c-axis orientation or a polarization axis of the piezoelectric substance, the second divided resonator including the piezoelectric substance sandwiched between another pair of electrodes so that the another pair of electrodes located in the direction of the c-axis orientation or the polarization axis is at an electric potential opposite to an electric potential of the pair of electrodes of the first divided resonator in the direction of the c-axis orientation or the polarization axis,
wherein a first resonator group, which includes the first divided resonators of the at least two series resonators and the parallel resonator between the at least two series resonators, and a second resonator group, which includes the second divided resonators of the at least two series resonators and the parallel resonator between the at least two series resonators, are connected in parallel to each other between a first node, which is closer to the input terminal than the first resonator group and the second resonator group, and a second node, which is closer to the output terminal than the first resonator group and the second resonator group,
wherein the first divided resonators and the second divided resonators of the at least two series resonators are not electrically interconnected at other than the first node and the second node, and
wherein a connection switching portion is formed at least between one of the first and second nodes and the first resonator group or the second resonator group, the connection switching portion switching connection to a lower electrode and connection to an upper electrode that are the pair of electrodes sandwiching the piezoelectric substance.

2. The acoustic wave filter according to claim 1, wherein in each of the at least two series resonators and the parallel resonator between the at least two series resonators, the first divided resonator has an electrostatic capacitance approximately equal to an electrostatic capacitance of the second divided resonator.

3. The acoustic wave filter according to claim 1, wherein in each of the at least two series resonators and the parallel resonator between the at least two series resonators, the first divided resonator has a resonant frequency approximately equal to a resonant frequency of the second divided resonator.

4. The acoustic wave filter according to claim 1, wherein in each of the at least two series resonators and the parallel resonator between the at least two series resonators, the first divided resonator has an impedance approximately equal to an impedance of the second divided resonator.

5. The acoustic wave filter according to claim 1, wherein a resonator closest to the output terminal among the two or more series resonators and the one or more parallel resonators is divided into the first divided resonator and the second divided resonator.

6. The acoustic wave filter according to claim 1, wherein the first divided resonator is further divided in at least one of the at least two series resonators and the parallel resonator between the at least two series resonators.

7. The acoustic wave filter according to claim 1, wherein a parallel resonator closest to the output terminal among the one or more parallel resonators is divided into the first divided resonator and the second divided resonator,
the acoustic wave filter further comprises an inductor connected in series between the first divided resonator and the second divided resonator that are divided from the parallel resonator closest to the output terminal and ground, and
the parallel resonator closest to the output terminal forms an attenuation pole in a frequency band twice a passband of the acoustic wave filter.

8. The acoustic wave filter according to claim 1, wherein all the two or more series resonators and all the one or more parallel resonators are divided into the first divided resonator and the second divided resonator.

9. The acoustic wave filter according to claim 1, wherein the connection switching portion is formed both between the first node and the first resonator group or the second resonator group and between the second node and the first resonator group or the second resonator group, the connection switching portion switching connection to a lower electrode and connection to an upper electrode that are the pair of electrodes sandwiching the piezoelectric substance.

10. A module comprising:
the acoustic wave filter according to claim 1.

11. A duplexer comprising:
a transmit filter; and
a receive filter,
wherein at least one of the transmit filter and the receive filter is the acoustic wave filter according to claim 1.

12. An acoustic wave filter comprising:
one or more series resonators connected in series between an input terminal and an output terminal and formed of a piezoelectric thin film resonator; and two or more parallel resonators connected in parallel between the input terminal and the output terminal and formed of a piezoelectric thin film resonator, wherein each of two parallel resonators and a series resonator between the two parallel resonators among the two or more parallel resonators and the one or more series resonators is divided into a first divided resonator and a second divided resonator, the first divided resonator including a piezoelectric substance sandwiched between a pair of electrodes in a direction of a c-axis orientation or a polarization axis of the piezoelectric substance, and the second divided resonator including the piezoelectric substance sandwiched between another pair of electrodes so that the another pair of electrodes in the direction of the c-axis orientation or the polarization axis is at an electric potential opposite to an electric potential of the pair of electrodes of the first divided resonator in the direction of the c-axis orientation or the polarization axis, wherein a first resonator group, which includes the first divided resonators of the two parallel resonators and the series resonator between the two parallel resonators, and a second resonator group, which includes the second divided resonators of the two parallel resonators and the series resonator between the two parallel resonators, are connected in parallel to each other between a first node, which is closer to the input terminal than the first resonator group and the second resonator group, and a second node, which is closer to the output terminal than the first resonator group and the second resonator group, wherein the first divided resonator and the second divided resonator of the series resonator between the two parallel resonators are not electrically interconnected at other than the first and second nodes, and wherein a connection switching portion is formed at least between one of the first and second nodes and the first resonator group or the second resonator group, the connection switching portion switching connection to a lower electrode and connection to an upper electrode that are the pair of electrodes sandwiching the piezoelectric substance.

13. A duplexer comprising:
a transmit filter; and
a receive filter,
wherein at least one of the transmit filter and the receive filter is the acoustic wave filter according to claim 12.

14. A module comprising:
an acoustic wave filter comprising:
one or more series resonators connected in series between an input terminal and an output terminal and formed of a piezoelectric thin film resonator; and
two or more parallel resonators connected in parallel between the input terminal and the output terminal and formed of a piezoelectric thin film resonator, wherein each of two parallel resonators and a series resonator between the two parallel resonators among the two or more parallel resonators and the one or more series resonators is divided into a first divided resonator and a second divided resonator, the first divided resonator including a piezoelectric substance sandwiched between a pair of electrodes in a direction of a c-axis orientation or a polarization axis of the piezoelectric substance, and the second divided resonator including the piezoelectric substance sandwiched between another pair of electrodes so that the another pair of electrodes in the direction of the c-axis orientation or the polarization axis is at an electric potential opposite to an electric potential of the pair of electrodes of the first divided resonator in the direction of the c-axis orientation or the polarization axis, wherein a first resonator group, which includes the first divided resonators of the two parallel resonators and the series resonator between the two parallel resonators, and a second resonator group, which includes the second divided resonators of the two parallel resonators and the series resonator between the two parallel resonators, are connected in parallel to each other between a first node, which is closer to the input terminal than the first resonator group and the second resonator group, and a second node, which is closer to the output terminal than the first resonator group and the second resonator group, wherein the first divided resonator and the second divided resonator of the series resonator between the two parallel resonators are not electrically interconnected at other than the first and second nodes, and wherein a connection switching portion is formed at least between one of the first and second nodes and the first resonator group or the second resonator group, the connection switching portion switching connection to a lower electrode and connection to an upper electrode that are the pair of electrodes sandwiching the piezoelectric substance.

\* \* \* \* \*